(12) United States Patent
Khemka et al.

(10) Patent No.: US 8,344,472 B2
(45) Date of Patent: Jan. 1, 2013

(54) SEMICONDUCTOR DEVICE AND METHOD

(75) Inventors: Vishnu K. Khemka, Phoenix, AZ (US);
Tahir A. Khan, Tempe, AZ (US);
Weixiao Huang, Tempe, AZ (US);
Ronghua Zhu, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 65 days.

(21) Appl. No.: 12/750,151

(22) Filed: Mar. 30, 2010

(65) Prior Publication Data
US 2011/0241083 A1    Oct. 6, 2011

(51) Int. Cl.
*H01L 29/66* (2006.01)
(52) U.S. Cl. .......................... 257/492; 257/493
(58) Field of Classification Search .............. 257/492, 257/493
See application file for complete search history.

(56) References Cited

U.S. PATENT DOCUMENTS

| | | | |
|---|---|---|---|
| 5,218,228 A * | 6/1993 | Williams et al. ............. 257/593 |
| 6,329,692 B1 | 12/2001 | Smith | |
| 6,528,380 B2 | 3/2003 | Woolery et al. | |
| 6,734,524 B1 | 5/2004 | Parthasarathy et al. | |
| 6,882,023 B2 | 4/2005 | Khemka et al. | |
| 6,930,027 B2 | 8/2005 | Parthasarathy et al. | |
| 7,087,973 B2 | 8/2006 | Mallikarjunaswamy et al. | |
| 7,187,033 B2 | 3/2007 | Pendharkar | |
| 7,282,386 B2 | 10/2007 | Khemka et al. | |
| 7,468,537 B2 | 12/2008 | Pendharkar | |
| 2002/0045301 A1* | 4/2002 | Sicard et al. ................. 438/197 |
| 2002/0119611 A1* | 8/2002 | Disney ........................ 438/197 |

(Continued)

FOREIGN PATENT DOCUMENTS
EP    1508918 A1    2/2005
(Continued)

OTHER PUBLICATIONS

Khemka, V., et al., Floating RESURF (FRESURF) LDMOSFET Devices with Breakthrough BVdss-Rdson (for example: 47V-0.28mW.cm2 or 93V-0.82 mW.cm2), Proc. of the Int. Symp. On Power Semicond. Dev and ICs, Japan, 2004.

(Continued)

*Primary Examiner* — Fernando L Toledo
*Assistant Examiner* — Karen Kusumakar
(74) *Attorney, Agent, or Firm* — Ingrassia Fisher & Lorenz, P.C.

(57) ABSTRACT

Transistors (21, 41) employing floating buried layers may be susceptible to noise coupling into the floating buried layers. In IGFETS this is reduced or eliminated by providing a normally-ON switch (80, 80') coupling the buried layer (102, 142, 172, 202) and the IGFET source (22, 42) or drain (24, 44). When the transistor (71, 91) is OFF, this clamps the buried layer voltage and substantially prevents noise coupling thereto. When the drain-source voltage $V_{DS}$ exceeds the switch's (80, 80') threshold voltage Vt, it turns OFF, allowing the buried layer (102, 142, 172, 202) to float, and thereby resume normal transistor action without degrading the breakdown voltage or ON-resistance. In a preferred embodiment, a normally-ON lateral JFET (801, 801', 801-1, 801-2, 801-3) conveniently provides this switching function. The lateral JFET (801-3) can be included in the device (70, 70', 90, 90') by mask changes without adding or customizing any process steps, thereby providing the improved noise resistance without significant increase in manufacturing cost. The improvement applies to both P (90-1) and N channel (70-1, 70-2, 70-3) transistors and is particularly useful for LDMOS devices.

20 Claims, 14 Drawing Sheets

U.S. PATENT DOCUMENTS

| | | | |
|---|---|---|---|
| 2004/0082133 A1* | 4/2004 | Salling et al. | 438/301 |
| 2004/0084744 A1* | 5/2004 | Khemka et al. | 257/492 |
| 2004/0104437 A1* | 6/2004 | Zecri et al. | 257/362 |
| 2006/0261408 A1* | 11/2006 | Khemka et al. | 257/335 |
| 2008/0296669 A1 | 12/2008 | Pendharkar et al. | |
| 2009/0294849 A1 | 12/2009 | Min et al. | |
| 2010/0226166 A1 | 9/2010 | Jung et al. | |

FOREIGN PATENT DOCUMENTS

| | | |
|---|---|---|
| JP | 2003303960 A | 10/2003 |
| WO | 2006013211 A1 | 2/2006 |

OTHER PUBLICATIONS

Khemka, V., et al., A Floating RESURF (FRESURF) LDMOSFET Device Concept, V, IEEE Electron Dev. Letts, vol. 24, No. 10, pp. 664-666, 2003.

Khemka, V., et al., Novel Floating RESURF (FRESURF) LDMOSFETs with Improved BVdss-Rdson, IEEE electron device letters vol. 25, No. 12, Dec. 2004 pp. 804-806.

Khan, T.,et al., Incremental FRESURF LDMOSFET Structure for Enhanced Voltage Blocking Capability on 1 0.13mm, SOI Based Technology, the Int. Symp. On Power Semicond. Dev and ICs, Orlando, 2008.

Parathasarthy, V., et al.,SOA Improvement by a Double RESURF LDMOS Technique in a Power IC Technology IEDM (2000).

Lee, J.,et al., Influence of NBL layout and LOCOS space on component ESD and system level ESD for HV-LDMOS, Lee et.al. ISPSD07, May 2007.

PCT/US2011/024983 International Search Report and Written Opinion mailed Sep. 28, 2011.

USPTO "Non-Final Office Action" mailed Mar. 1, 2012; U.S. Appl. No. 12/750,166, filed Mar. 30, 2010.

USPTO "Notice of Allowance" mailed Sep. 6, 2012; U.S. Appl. No. 12/750,166, filed Mar. 30, 2010.

\* cited by examiner

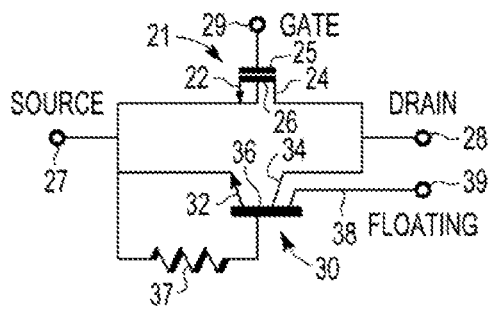
20 FIG. 1
- PRIOR ART -
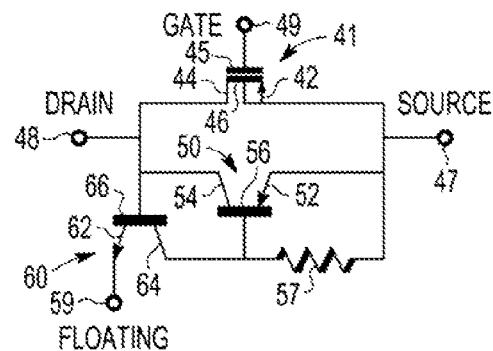
40 FIG. 2
- PRIOR ART -
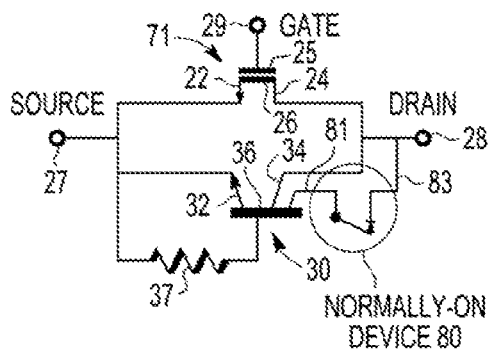
70 FIG. 3
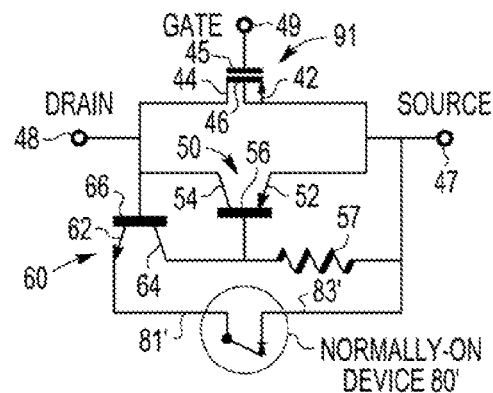
90 FIG. 4
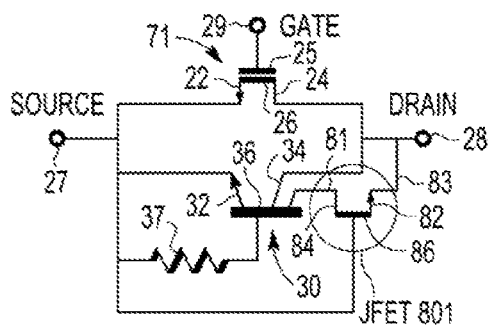
70' FIG. 5
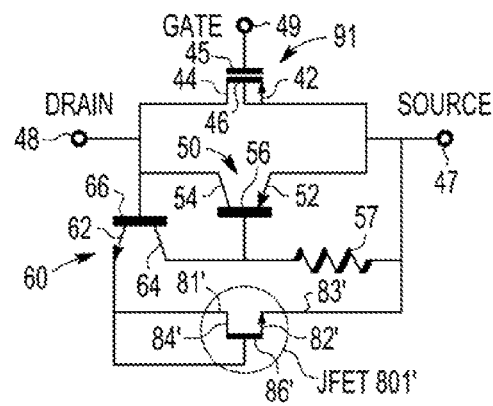
90' FIG. 6

SEMICONDUCTOR DEVICE AND METHOD

FIELD OF THE INVENTION

The field of the invention generally relates to semiconductor devices and methods for fabricating semiconductor devices, and more particularly relates to insulated gate field effect transistor (IGFET) devices.

BACKGROUND OF THE INVENTION

Insulated gate field effect transistor (IGFET) devices are widely used in modern electronic applications. Metal-oxide-semiconductor field effect transistor (MOSFET) devices and lateral-(double)-diffused-metal-oxide-semiconductor (LDMOS) devices are well known examples of such IGFET devices. As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET". It is known that improved performance of LDMOS devices can be obtained by using reduced surface field (RESURF) structures.

BRIEF DESCRIPTION OF THE DRAWINGS

Embodiments will hereinafter be described in conjunction with the following drawing figures, wherein like numerals denote like elements, and wherein:

FIG. 1 is a simplified electrical schematic diagram of an N-channel LDMOS RESURF transistor including a MOSFET and parasitic bipolar transistor associated therewith, according to the prior art;

FIG. 2 is a simplified electrical schematic diagram of a P-channel LDMOS RESURF transistor including a MOSFET and parasitic bipolar transistors associated therewith;

FIG. 3 is a simplified electrical schematic diagram of an N-channel LDMOS RESURF transistor including a MOSFET, a parasitic bipolar transistor associated therewith and a buried layer noise immunity clamp, according to an embodiment of the present invention;

FIG. 4 is a simplified electrical schematic diagram of a P-channel LDMOS RESURF transistor including a MOSFET, parasitic bipolar transistor associated therewith and a buried layer noise immunity clamp, according to another embodiment of the present invention;

FIG. 5 is a simplified electrical schematic diagram of an N-channel LDMOS RESURF transistor including a MOSFET, a parasitic bipolar transistor associated therewith and a JFET buried layer noise immunity clamp, according to still another embodiment of the present invention;

FIG. 6 is a simplified electrical schematic diagram of a P-channel LDMOS RESURF transistor including a MOSFET, parasitic bipolar transistor associated therewith and a JFET buried layer noise immunity clamp, according to yet another embodiment of the present invention;

DETAILED DESCRIPTION OF THE INVENTION

Figure 7:
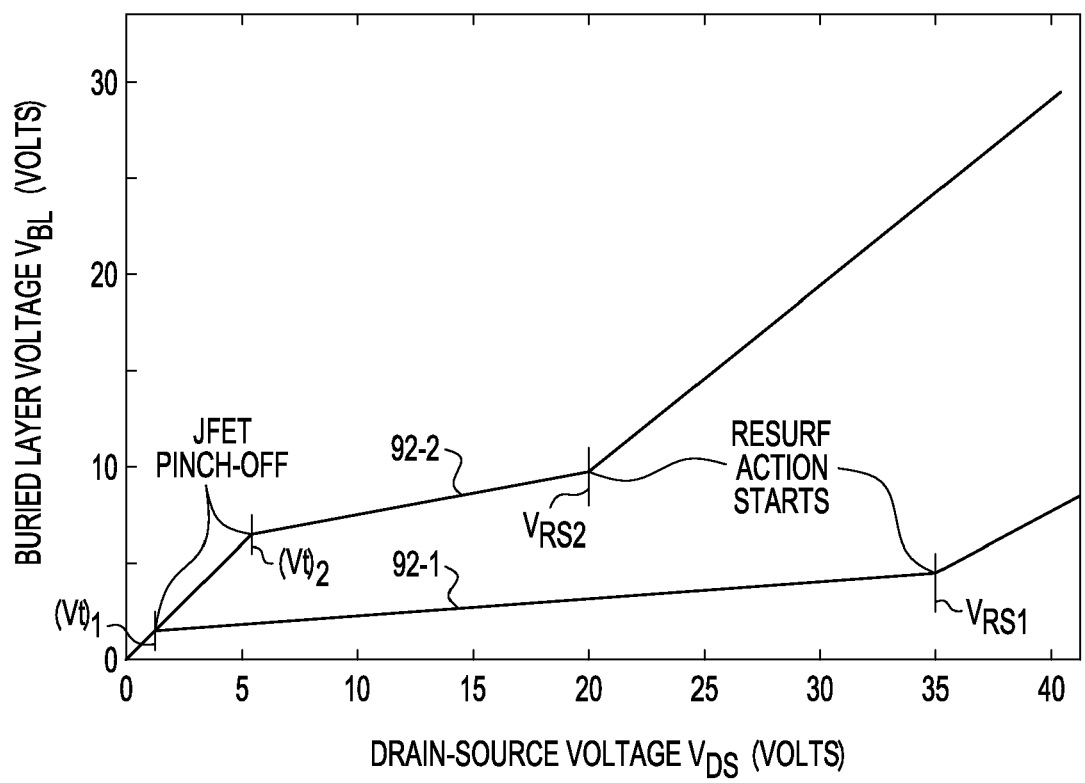
FIG. 7 is a simplified plot of the buried layer voltage $V_{BL}$ versus drain-source voltage $V_{DS}$ in volts, for the device of FIG. 5.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" (abbreviated as "SC") is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. The term "semiconductor" is abbreviated as "SC." For convenience of explanation and not intended to be limiting, semiconductor devices and methods of fabrication are described herein for silicon semiconductors but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type then is either P or N type.

FIG. 1 is a simplified electrical schematic diagram of N-channel LDMOS RESURF transistor 20 including MOSFET 21 and parasitic bipolar transistor 30 associated therewith, according to the prior art. MOSFET 21 comprises N-type source 22 and drain 24, and conductive gate 25 insulated from and overlying P-type body region 26. Source 22 is coupled to source terminal 27 and drain 24 is coupled to drain terminal 28. Parasitic bipolar transistor 30 exists between source 22 (and source terminal 27) and drain 24 (and drain terminal 28). Parasitic bipolar transistor 30 comprises N-type emitter 32 (e.g., associated with source 22), N-type collector 34 (e.g., associated with drain 24), P-type base region 36 (e.g., associated with body region 26) and internal body resistance 37. Resistance 37 and emitter 32 are coupled to source terminal 27. Collector 34 is coupled to drain terminal 28. U.S. Pat. No. 6,882,023 describes a physical RESURF LDMOS structure that can be represented by the simplified electrical schematic diagram of FIG. 1 including N and P type RESURF regions (not shown in the schematic) under which is provided a floating buried layer (e.g., N type) identified in FIG. 1 by the label "FLOATING" 39, which has no external connection.

FIG. 2 is a simplified electrical schematic diagram of P-channel LDMOS RESURF transistor 40 with MOSFET 41, parasitic bipolar transistor 50 associated therewith and further parasitic bipolar device 60. Further parasitic bipolar device 60 arises because of the presence of an N type floating buried layer (not shown in the schematic of FIG. 2) underlying MOSFET 41 and parasitic bipolar device 50 in LDMOS transistor 40. In this respect, LDMOS transistor 40 of FIG. 2 differs from what would be obtained by simply exchanging the N and P regions of LDMOS transistor 20 of FIG. 1. MOSFET 41 comprises P-type source 42 and drain 44, and conductive gate 45 insulated from and overlying N-type body region 46. Source 42 is coupled to source terminal 47 and drain 44 is coupled to drain terminal 48. Parasitic bipolar transistor 50 exists between source 42 (and source terminal 47) and drain 44 (and drain terminal 48). Parasitic bipolar transistor 50 comprises P-type emitter 52 (e.g., associated with source 42), P-type collector 54 (e.g., associated with drain 44), N-type base region 56 (e.g., associated with body region 46) and internal body resistance 57. Resistance 57 and emitter 42 are coupled to source terminal 47. Collector region 54 is coupled to drain terminal 48. P and N type RESURF regions and underlying N type floating buried layer (not shown in the schematic) are included in transistor 40, thereby giving rise to further parasitic bipolar transistor 60. Further parasitic bipolar transistor 60 has P type base 66 coupled to P type collector region 54 of parasitic bipolar 50 and P type drain 44, N type collector 64 coupled to N type base of parasitic bipolar transistor 50, and N type emitter 62 coupled to terminal 59, identified in FIG. 2 by the label "FLOATING" 59, which has no external connection.

Floating buried layer RESURF devices represented by the electrical schematic diagrams of FIGS. 1 and 2 can provide substantially improved breakdown voltages $BV_{dss}$ and relatively low ON resistance $R_{dson}$. However, the relatively large area floating buried layer in such devices that lies between the LDMOS device and the substrate may make such LDMOS device susceptible to spurious signal pick-up (e.g., noise) from elsewhere in an integrated circuit (IC) of which the LDMOS device may be a part, especially when the LDMOS device is in an OFF state. Accordingly, a need continues to exist to reduce the sensitivity of such floating buried layer RESURF LDMOS devices to substrate induced noise and fast applied transients. It has been discovered that this be accomplished by the circuits illustrated in FIGS. 3-6 and the structures illustrated hereafter, according to various embodiments of the invention.

FIG. 3 is a simplified electrical schematic diagram of N-channel LDMOS RESURF transistor 70 with MOSFET 71, parasitic bipolar transistor 30 associated therewith and buried layer noise immunity clamp 80, according to an embodiment of the present invention. For convenience of explanation and not intended to be limiting, the same reference numbers have been used in FIGS. 3 and 4 as in FIGS. 1 and 2 to identify analogous elements or regions. MOSFET 71 comprises N-type source 22 and drain 24, and conductive gate 25 insulated from and overlying P-type body region 26. Source 22 is coupled to source terminal 27 and drain 24 is coupled to drain terminal 28. Parasitic bipolar transistor 30 exists between source 22 (and source terminal 27) and drain 24 (and drain terminal 28). Parasitic bipolar transistor 30 comprises N-type emitter 32 (e.g., associated with source 22), N-type collector 34 (e.g., associated with drain 24), P-type base region 36 (e.g., associated with body region 26) and internal body resistance 37. Resistance 37 and emitter 32 are coupled to source terminal 27. Collector 34 is coupled to drain terminal 28. LDMOS device 70 of FIG. 3 differs from prior art LDMOS device 20 of FIG. 1 by the addition of transistor or other switching element 80 serving as a buried layer noise immunity clamp, coupling parasitic bipolar device 30 to drain terminal 28. Switching element 80 may be any type of normally-ON device, that is, a device that is in a conductive state at zero applied voltage and that turns-OFF at a voltage |Vt|>0, referred to as the threshold voltage. Switching element 80 may be internal to device 70 or external to device 70. Either arrangement is useful. For convenience of description switching element 80 is also referred to as buried layer noise immunity clamp 80. Lead 83 of switching element 80 is coupled to drain terminal 28 and lead 81 of switching element 80 is coupled to what was lead 38 (see FIG. 1) of floating terminal 39 of FIG. 1. Switching element 80 is identified in FIG. 3 as a "Normally-ON Device" since, as has been explained, it is desirably conductive at low drain-source voltages across terminals 28, 27 of LDMOS device 70 (e.g., for $|V_{DS}|<|Vt|$) so that the otherwise floating buried layer of device 70 is substantially electrically pinned and therefore protected against picking up noise induced in the buried layer from elsewhere in the circuit or IC of which device 70 may be a part. When $|V_{DS}|$ equals or exceeds |Vt|, device or element 80 turns OFF, whereupon the associated buried layer of device 70 can thereafter float and normal floating RESURF action is thereafter obtained. Thus, the buried layer underlying device 70 becomes conditionally floating, that is, electrically pinned at low voltage when device 80 is normally-ON and floating after device 80 turns OFF. This reduces or eliminates the susceptibility of device 70 to undesirable substrate noise coupling into the buried layer, without degrading the $BV_{dss}$ or $R_{dss}$ and also reduces the adverse impact of fast transients on the break-down voltage $BV_{dss}$. Thus, switching element 80 serves as an effective noise immunity clamp for LDMOS transistor 70 and the IC of which it may be a part. This is a desirable outcome and a significant advance in the art. The physical relationship of device 80 to devices 71 and 30 is more fully explained by way of example in connection with FIG. 5 and following, where various embodiments thereof are described.

FIG. 4 is a simplified electrical schematic diagram of P-channel LDMOS RESURF transistor 90 with MOSFET transistor 91, parasitic bipolar transistor 50 associated therewith and further switching element 80' acting as a buried layer noise immunity clamp, according to another embodiment of the present invention. For convenience of explanation and not intended to be limiting, the same reference numbers have been used in FIGS. 3 and 4 as in FIGS. 1 and 2 to identify analogous elements or regions. MOSFET 91 comprises P-type source 42 and drain 44, and conductive gate 45 insulated from and overlying N-type body region 46. Source 42 is coupled to source terminal 47 and drain 44 is coupled to drain terminal 48. Parasitic bipolar transistor 50 exists between source 42 (and source terminal 47) and drain 44 (and drain terminal 48). Parasitic bipolar transistor 50 comprises P-type emitter 52 (e.g., associated with source 42), P-type collector region 54 (e.g., associated with drain 44), N-type base region 56 (e.g., associated with body region 46) and internal body resistance 57. Resistance 57 and emitter 42 are coupled to source terminal 47. Collector region 54 is coupled to drain terminal 48. P and N type RESURF regions and an N type buried layer (not shown in the schematic) are included in transistor 90, thereby giving rise to further parasitic bipolar transistor 60. Further parasitic bipolar transistor 60 has P type base 66 coupled to P type collector region 54 of parasitic bipolar 50 and P type drain 44, and has N type collector 64 coupled to N type base region 56 of parasitic bipolar transistor 50, and has N type emitter 62 coupled to switching lead 81' of device 80'. LDMOS device 90 of FIG. 4 differs from LDMOS device 40 of FIG. 2 by the addition of normally-ON switching element or device 80', coupling further parasitic device 60 to source terminal 47. Any type of normally-ON switching element having an appropriate turn-OFF threshold voltage Vt may be used. Lead 83' of switching element 80' is coupled to source terminal 47 and lead 81' of switching element 80' is coupled to what was floating terminal 59 of FIG. 2 and emitter 62 of further parasitic transistor 60. Switching device 80' is identified in FIG. 4 as a "Normally-ON Device" since, as has been explained, it is conductive at low drain-source voltages (e.g., $|V_{DS}|<|Vt|$) across terminals 47, 48 of LDMOS device 90 so that the otherwise floating buried layer of device 90 is conditionally floating, that is, substantially electrically pinned to the source voltage up to the threshold voltage Vt where device 80' turns OFF, whereupon the associated buried layer of device 90 can thereafter float and floating RESURF action resumes. As has been explained, this reduces or eliminates the susceptibility of device 90 to undesirable substrate noise coupling into the buried layer, without degrading $BV_{dss}$ or $R_{dss}$ and also reduces the adverse impact of fast transients on $BV_{dss}$. This is a desirable outcome and a significant advance in the art. The physical relationship of device 80' to devices 91 and 30 is more fully explained by way of example in connection with FIG. 9.

FIG. 5 is a simplified electrical schematic diagram of N-channel LDMOS RESURF transistor 70' including MOSFET 71 and parasitic bipolar transistor 30 associated therewith, wherein buried layer noise immunity clamp or switching element 80 is implemented as normally-ON JFET 801 having threshold (turn-OFF) voltage Vt, according to still another embodiment of the present invention. Drain 84 of JFET 801 is coupled to lead 81 of switching element 80 of FIG. 3; source 82 of JFET 801 is coupled to lead 83 of switching element 80 of FIG. 3 and body region 86 of JFET 801 is coupled to terminal 27, source 22 of FET 71 and emitter 32 of parasitic bipolar transistor 30. Reference should be had to the discussion of FIG. 3 with respect to the other device regions making up LDMOS transistor 70' of FIG. 5.

FIG. 6 is a simplified electrical schematic diagram of P-channel LDMOS RESURF transistor 90' including MOSFET 91 and parasitic bipolar transistor 50 associated therewith, wherein buried layer noise immunity clamp (e.g., switching element) 80' is implemented as normally-ON JFET 801' having threshold (turn-OFF) voltage Vt, according to yet another embodiment of the present invention. Drain 84' of JFET 801' is coupled to lead 81' of switching element 80' of FIG. 4, source 82' of JFET 801' is coupled to lead 83' of switching element 80' of FIG. 4, and body region 86' of JFET 801' is coupled to emitter 62 of further parasitic transistor 60. Reference should be had to the discussion of FIG. 4 with respect to the other device regions making up LDMOS transistor 90' of FIG. 6.

FIG. 7 shows simplified plot 92 of the buried layer voltage $V_{BL}$ versus drain-source voltage $V_{DS}$ in volts, for example, for the device of FIG. 5 according to two embodiments, wherein trace 92-1 corresponds to a JFET having turn-OFF threshold $(Vt)_1 \sim 1$ volt and trace 92-2 corresponds to a JFET having turn-OFF threshold $(Vt)_2 \sim 6$ volts. In the case of trace 92-2, floating RESURF action starts at voltage $V_{DS}=V_{RS1} \sim 35$ volts and, in the case of trace 92-2, floating RESUF action starts at $V_{DS}=V_{RS2} \sim 20$ volts. Above $(Vt)_1$ and $(Vt)_2$, buried layers 102, 142, 172, 202 of FIGS. 8-12 are floating and their voltage $V_{BL}$ can rise above $V_{RS1}$ and $V_{RS2}$ when punch-through has occurred, in proportion to the applied drain-source voltage $V_{DS}$, thereby facilitating floating RESURF action in LDMOS device 70, 90. This behavior is highly desirable and protects LDMOS devices 70, 90 and other devices of the IC with which LDMOS devices 70, 90 may be associated, from noise pickup by buried layers 102, 142, 172, 202 of LDMOS device 70, 90. This is a significant and desirable advance in the art.

Figure 8:
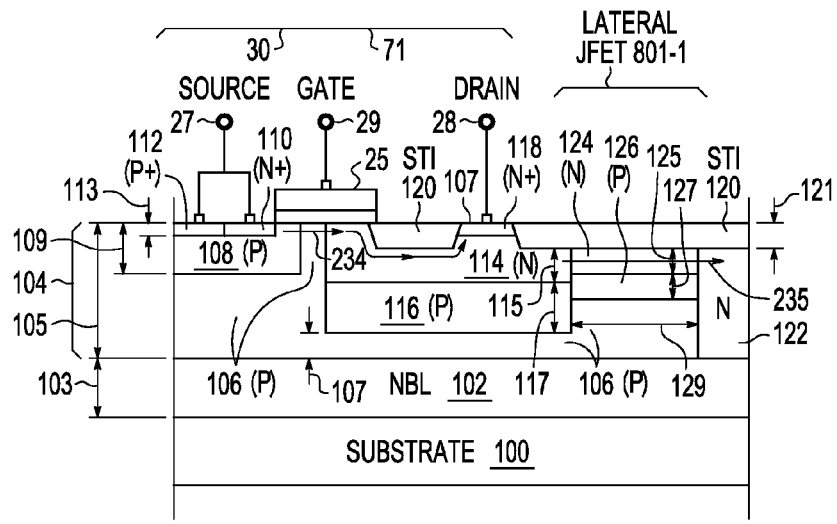
FIG. 8 is a simplified cross-sectional view through a transistor of the type illustrated in FIG. 5, showing how the device of FIG. 5 may be conveniently implemented in a monolithic substrate using a lateral JFET buried layer noise immunity clamp, according to a further embodiment of the present invention.

FIG. 8 is a simplified cross-section view through transistor 70-1, showing how transistor 70' of FIG. 5 may be conveniently implemented in a monolithic substrate, according to a further embodiment of the present invention using lateral JFET 801-1. Where appropriate, the same reference numbers have been used in FIG. 8 as in FIG. 5 to facilitate correlation between FIGS. 5 and 8. For convenience of explanation and not intended to be limiting, preferred N and P conductivity types are included in the description and the drawings with the various reference numbers, by way of example and not limitation. Persons of skill in the art will understand that such conductivity types may be interchanged in other embodiments or referred to as of a first conductivity type, which may be either N or P, and of a second opposite conductivity type which is then either P or N. The thickness and doping of the various regions making up transistor 70-1 are described more fully in connection with FIGS. 13-21.

Transistor 70-1 of FIG. 8 comprises semiconductor (SC) containing substrate 100 (e.g., P type) with overlying buried layer 102 (e.g., N type, abbreviated as "NBL 102") of thickness 103. Above buried layer 102 is further overlying (e.g., P type epi) SC region 104 of thickness 105 extending to surface 107. Located within overlying region 104 is body region 108 (e.g., P type) of thickness 109. Body region 108 is generally of somewhat higher doping concentration than overlying region 104. Within body region 108 are (e.g., N+) source region 110 corresponding to source 22 of FIG. 5 and (e.g., P+) body contact region 112. Portion 106 of overlying SC region 104 underlies body region 108 and other portions of overlying SC region 104 not occupied by other doped regions described above and hereafter. Also located within overlying SC region 104 are (e.g., N type) carrier drift region 114 of thickness 115 and (e.g., P type) RESURF region 116 of thickness 117, which generally underlies carrier drift region 114. As is well known in the art, to obtain RESURF action, charge balancing should be provided between regions 114 and 116 and is hereafter presumed. Doped contact (e.g., N+) region 118 corresponding to drain 24 of FIG. 5 is provided within carrier drift region 114 extending to surface 107. When source terminal 27, drain terminal 28 and gate terminal 29 are appropriately biased, conductive channel 234 forms between source region 110 and drain region 118. Shallow Trench Isolation (STI) regions 120 of depth 121 are desirably provided extending from surface 107 into SC region 104 in the locations indicated. STI regions 120 may be omitted in other embodiments. Sinker region 122 (e.g., N type) extends from beneath STI region 120 (when present) through further SC region 104 to make non-rectifying electrical contact to buried layer 102. JFET switching device 801-1 is conveniently formed between sinker region 122 and carrier drift region 114, wherein JFET channel region 124 (e.g., N type) has thickness 125 beneath STI region 120 (when present).

It is desirable that JFET channel region 124 make non-rectifying electrical contact to carrier drift region 114 and sinker region 122 of the same conductivity type, thereby forming JFET transistor 80. Drain region 118 (e.g., N+) and carrier drift region 114 (e.g., N) of MOSFET 71 act as the source, and sinker region 122 (e.g., N) acts as the drain of JFET 801-1. Normally-ON JFET 801-1 has conductive channel 235 extending between doped region 118 and sinker region 122 until JFET 801-1 turns OFF with rising voltage. It will be noted that channel 234 of MOSFET 30, 71 and channel 235 of JFET 801-1 are spaced apart and oriented in substantially similar directions, that is, laterally rather than orthogonally in FIG. 8. JFET 801-1, desirably has channel length 129 between carrier drift region 114 and sinker region 122 usefully in the range of about 0.5 to 10 micrometers, more conveniently in the range of about 1.0 to 2.0 micrometers and preferably about 1.0 micrometers, but larger or smaller values may also be used. It is desirable that JFET channel region thickness 125 is usefully about 10 to 90, more conveniently about 20 to 70 and preferably about 50 percent of carrier drift region thickness 115, but larger or smaller values can also be used. It is desirable that (e.g., P type) gate region 126 of thickness 127 be provided beneath JFET channel region 124. It is desirable that JFET gate region thickness 127 is usefully about 10 to 90, more conveniently about 20 to 70 and preferably about 50 percent of RESURF region thickness 117, but larger or smaller values can also be used.

The doping and dimensions of JFET transistor 801-1 are desirably chosen so that JFET transistor 801-1 is in a normally-ON state when the drain-source voltage $V_{DS}$ is substantially zero, and has a threshold voltage $|Vt|>0$ such that, JFET transistor 801-1 turns off as $V_{DS}$ increases. By controlling the threshold voltage Vt of JFET 801-1, the transition from the low noise coupling region for $|V_{DS}|<|Vt|$ into the normal floating RESURF action region of device behavior may be controlled, which is a further advantage of the described embodiments. This is illustrated in connection with FIG. 7. In a preferred embodiment, |Vt| is usefully in the range of about 0.1 to 10 volts, more conveniently in the range of about 0.5 to 5.0 volts and preferably about 1.0 to 2.0 volts, but larger or smaller values may also be used. The threshold voltage Vt of JFET 801-1 can be adjusted by varying the doping and thickness of channel region 124 and/or the doping and thickness of underlying region 126. (This also applies to the embodiments illustrated in FIGS. 9-12 taking into account the differences in the JFET channel regions therein.) As long as JFET transistor 801-1 is substantially conductive (having a voltage smaller than Vt), the voltage $V_{BL}$ of buried layer 102 is effectively electrically clamped and cannot rise significantly and noise coupling thereto is insignificant, thereby substantially improving the noise immunity of LDMOS device 70-1 and the IC or other circuit of which it is a part. This is a significant advance in the art.

Figure 9:
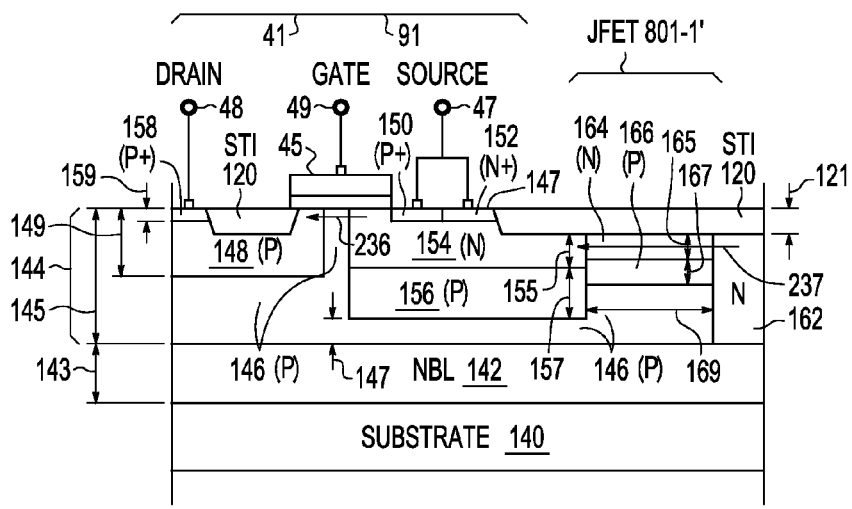
FIG. 9 is a simplified cross-sectional view, analogous to that of FIG. 8, through a transistor of the type illustrated in FIG. 6, showing how the device of FIG. 6 may be conveniently implemented in a monolithic substrate using a lateral JFET buried layer noise immunity clamp, according to a still further embodiment of the present invention.

FIG. 9 is a simplified cross-section view, analogous to that of FIG. 8, through transistor 90-1 of the type illustrated in FIG. 6, showing how device 90' of FIG. 6 may be conveniently implemented in a monolithic substrate using lateral JFET 801-1' in combination with MOSFET 91 and parasitic bipolar transistor 50, according to a still further embodiment of the present invention. Where appropriate, the same reference numbers have been used in FIG. 9 as in FIG. 6 to facilitate correlation between FIGS. 6 and 9. For convenience of explanation and not intended to be limiting, preferred N and P conductivity types are included, in the description and the drawings with the various reference numbers by way of example and not limitation. Persons of skill in the art will understand that such conductivity types may be interchanged in other embodiments or referred to as of a first conductivity type, which may be either N or P, and of a second opposite conductivity type which is then either P or N. The thickness and doping of the various regions making up transistor 90-1 are described more fully in connection with FIGS. 13-21.

Transistor 90-1 of FIG. 9 comprises semiconductor (SC) containing substrate 140 (e.g., P type) with overlying buried layer 142 (e.g., N type, abbreviated as "NBL 142") of thickness 143. Above buried layer 142 is further overlying (e.g., P type epi) SC region 144 of thickness 145 extending to surface 147. Portion 146 of overlying SC region 144 refers to those areas within overlying SC region 144 not occupied by other doped regions described hereafter. Located within overlying region 144 is body region 154 (e.g., N type) of thickness 155. Body region 154 is generally of somewhat higher doping concentration than overlying region 144. Within body region 154 are (e.g., P+) source region 150 corresponding to source 42 of FIG. 6 and (e.g., N+) body contact region 152. RESURF region 156 (e.g., P type) of thickness 157 is provided beneath body region 154. Also located within overlying SC region 144 is (e.g., P type) carrier drift region 148 of thickness 149. Doped contact (e.g., P+) region 158 corresponding to drain 44 of FIG. 6 is provided within carrier drift region 148 extending to surface 147. When source terminal 47, drain terminal 48 and gate terminal 49 are appropriately biased, conductive channel 236 forms between source region 150 and drain region 158. Shallow Trench Isolation (STI) regions 120 of depth 121 are conveniently provided extending from surface 147 into SC region 144 in the locations indicated. STI regions 120 may be omitted in other embodiments.

Sinker region 162 (e.g., N type) extends from beneath STI region 120 (when present) through further SC region 144 to make non-rectifying electrical contact to buried layer 142. JFET switching device 801-1' is conveniently formed between sinker region 162 and body region 154, wherein JFET channel region 164 (e.g., N type) has thickness 165 beneath STI region 120 (when present). It is desirable that JFET channel region 164 make non-rectifying electrical contact to body region 154 and sinker region 162 of the same conductivity type, thereby forming JFET transistor 801-1'. Normally-ON JFET 801-1' has conductive channel 237 extending between doped region 152 and sinker region 162 until JFET 801-1' turns OFF with rising voltage. It will be noted that channel 236 of MOSFET 30, 91 and channel 237 of JFET 801-1' are spaced apart and oriented in substantially similar directions, that is, laterally rather than orthogonally in FIG. 9.

JFET transistor 801-1', desirably has channel length 169 between body region 154 and sinker region 162 usefully in the range of about 0.5 to 10 micrometers, more conveniently in the range of about 1.0 to 2.0 micrometers and preferably about 1.0 micrometers, but larger or smaller values may also be used. It is desirable that JFET channel region thickness 165 is usefully about 10 to 90, more conveniently about 20 to 70 and preferably about 50 percent of body region thickness 155, but larger or smaller values can also be used. It is desirable that (e.g., P type) gate region 166 of thickness 167 be provided beneath JFET channel region 164. It is desirable that JFET gate region thickness 167 is usefully about 10 to 90, more conveniently about 20 to 70 and preferably about 50 percent of RESURF region thickness 157, but larger or smaller values can also be used.

The doping and dimensions of JFET transistor 801-1' are desirably chosen so that JFET transistor 801-1' is in a normally-ON state when the drain-source voltage $V_{DS}$ is substantially zero, and has a threshold voltage |Vt|>0 such that, JFET transistor 801-1' turns off as $V_{DS}$ increases. By controlling the threshold voltage Vt of JFET 801-1', the transition from the low noise coupling region for $|V_{DS}|<|Vt|$ into the normal floating RESURF action region of device behavior may be controlled, which is a further advantage of the described embodiments. In a preferred embodiment, |Vt| is usefully in the range of about 0.1 to 10 volts, more conveniently in the range of about 0.5 to 5.0 volts and preferably about 1.0 to 2.0 volts, but larger or smaller values may also be used. As long as JFET transistor 801-1' is substantially conductive (having a voltage smaller than |Vt|), the voltage $V_{BL}$ on buried layer 142 is substantially clamped and cannot rise significantly and noise coupling thereto is insignificant, thereby substantially improving the noise immunity of LDMOS device 90-1 and the IC or other circuit of which it is a part. This is a significant advance in the art.

Figure 10:
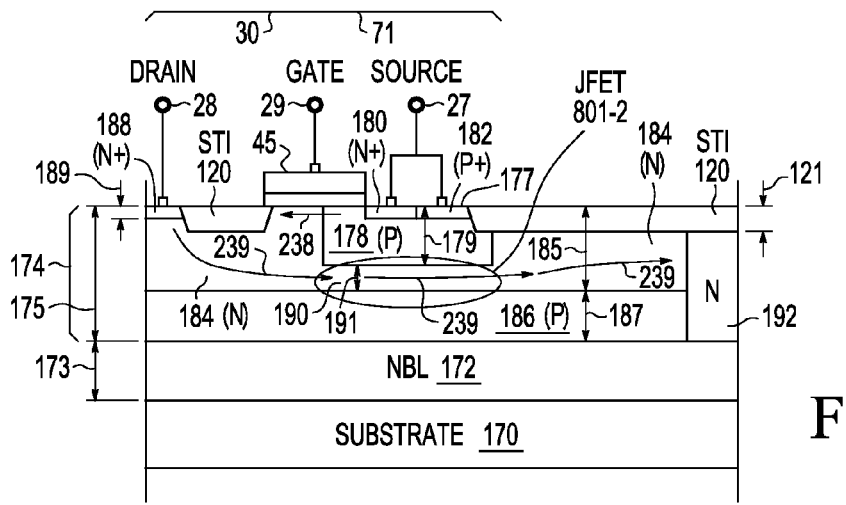
FIG. 10 is a simplified cross-sectional view, analogous to that of FIG. 8, through a transistor of the type illustrated in FIG. 5, showing how the device of FIG. 5 may be conveniently implemented in a monolithic substrate using another JFET buried layer noise immunity clamp, according to a yet further embodiment of the present invention.

FIG. 10 is a simplified cross-section view, analogous to that of FIG. 8, through transistor 70-2 of the type illustrated in FIG. 5, showing how device 70' of FIG. 5 may be conveniently implemented in a monolithic substrate using JFET 801-2, according to a yet further embodiment of the present invention. Where appropriate, the same reference numbers have been used in FIG. 10 as in FIG. 5 to facilitate correlation between FIGS. 5 and 10. For convenience of explanation and not intended to be limiting, preferred N and P conductivity types are included, in the description and the drawings with the various reference numbers by way of example and not limitation. Persons of skill in the art will understand that such conductivity types may be interchanged in other embodiments or referred to as of a first conductivity type, which may be either N or P, and of a second opposite conductivity type which is then either P or N. The thickness and doping of the various regions making up transistor 70-2 are described more fully in connection with FIGS. 13-21.

Transistor 70-2 of FIG. 10 comprises semiconductor (SC) containing substrate 170 (e.g., P type) with overlying buried layer (e.g., N type, abbreviated as "NBL 172") of thickness 173. Above buried layer 172 is further overlying (e.g., P type epi) SC region 174 of thickness 175 extending to surface 177. Located within overlying SC region 174 are (e.g., N type) carrier drift region 184 of thickness 185 and (e.g., P type) underlying RESURF region 186 of thickness 187. Located within carrier drift region 184 is body region 178 (e.g., P type) of thickness 179. Within body region 178 are (e.g., N+) source region 180 corresponding to source 22 of FIG. 5 and (e.g., P+) body contact region 182. Doped contact (e.g., N+) region 188 corresponding to drain 24 is provided within carrier drift region 184 extending to surface 177. When source terminal 27, drain terminal 28 and gate terminal 29 are appropriately biased, conductive channel 238 forms between source region 180 and drain region 188. Shallow Trench Isolation (STI) regions 120 of depth 121 are provided extending from surface 177 into SC region 174 in the locations indicated. STI regions 120 may be omitted in other embodiments.

Sinker region 192 (e.g., N type) extends from beneath STI region 120 (when present) through further SC region 174 to make non-rectifying electrical contact to buried layer 172. Portion 190 (e.g., N type) having thickness 191 of carrier drift region 184 underlies body region 178. JFET switching device 801-2 is conveniently formed using portion 190 between body region 178 and underlying (e.g. P type) region 186 and therefore has a channel thickness corresponding to thickness 191 of portion 190. For voltages less than |Vt|, normally-ON JFET 801-2 is adapted to provide conductive channel 239 passing between (e.g., P type) regions 178 and 186 that act as the gates of JFET 801-2. Channel 239 extends from (e.g., N type) doped region 184 on the left (with (e.g., N+) drain contact 188) to (e.g., N type) doped region 184 on the right that makes non-rectifying electrical contact with (e.g., N type) doped sinker 192, which in turn makes non-rectifying electrical contact to (e.g. N type) doped buried layer 172. The presence of normally-ON JFET 801-2 electrically pins the voltage of buried layer 172 until |Vt| is exceeded, whereupon JFET 801-2 turns off and normal floating RESURF action resumes. Thus, JFET 801-2 also provides the desired noise clamping.

It will be noted that conductive channel 238 of MOSFET 30, 71 of FIG. 10 is substantially lateral and conductive channel 239 of JFET 801-2 is also substantially lateral. However, unlike the embodiments of FIGS. 8-9 wherein JFET channels 235, 237 were in the same general direction but laterally displaced from MOSFET channels 234, 236, JFET channel 239 of FIG. 10 while also in the same general lateral directions as MOSFET channel 238, at least partly underlies MOSFET channel 238. It is desirable that JFET channel region 190 has a doping density that is less than the doping density of overlying body region 178 and underlying region 186 usefully by a factor about in the range 0.01 to 1, more conveniently in the range of about 0.1 to 0.5 and preferably about a factor of 0.1, but larger or smaller values may also be used. Channel thickness 191 is usefully in the range of about 0.1 to 2.0 micrometers, conveniently in the range of about 0.2 to 1.0 micrometers and preferably about 0.4 micrometers, but larger or smaller values may also be used.

The threshold voltage Vt of lateral JFET 801-2 provided by region 190 with adjacent gates 178 and 186 may be adjusted, for example, by changing the thickness and doping of region 190, as is well understood in the art. Vt is desirably chosen so that JFET transistor 801-2 is in a normally-ON state when the drain-source voltage $V_{DS}$ is substantially zero, and has a threshold voltage |Vt|>0 such that, JFET transistor 80-2 turns off as $V_{DS}$ increases. By controlling the threshold voltage Vt of JFET 801-2, the transition from the low noise coupling region for $|V_{DS}|<|Vt|$ into the normal RESURF action region of device behavior may be controlled, which is a further advantage of the described embodiments. In a preferred embodiment, |Vt| is usefully in the range of about 0.1 to 10 volts, more conveniently in the range of about 0.5 to 5.0 volts and preferably about 1.0 to 2.0 volts, but larger or smaller values may also be used. As long as JFET transistor 801-2 is substantially conductive (having a voltage smaller than |Vt|), the voltage $|V_{BL}|$ on buried layer 172 is substantially clamped and cannot rise significantly and noise coupling thereto is insignificant, thereby substantially improving the noise immunity of LDMOS device 70-2 and the IC or other circuit of which it is a part. This is an important advantage and a significant advance in the art.

Figure 11:
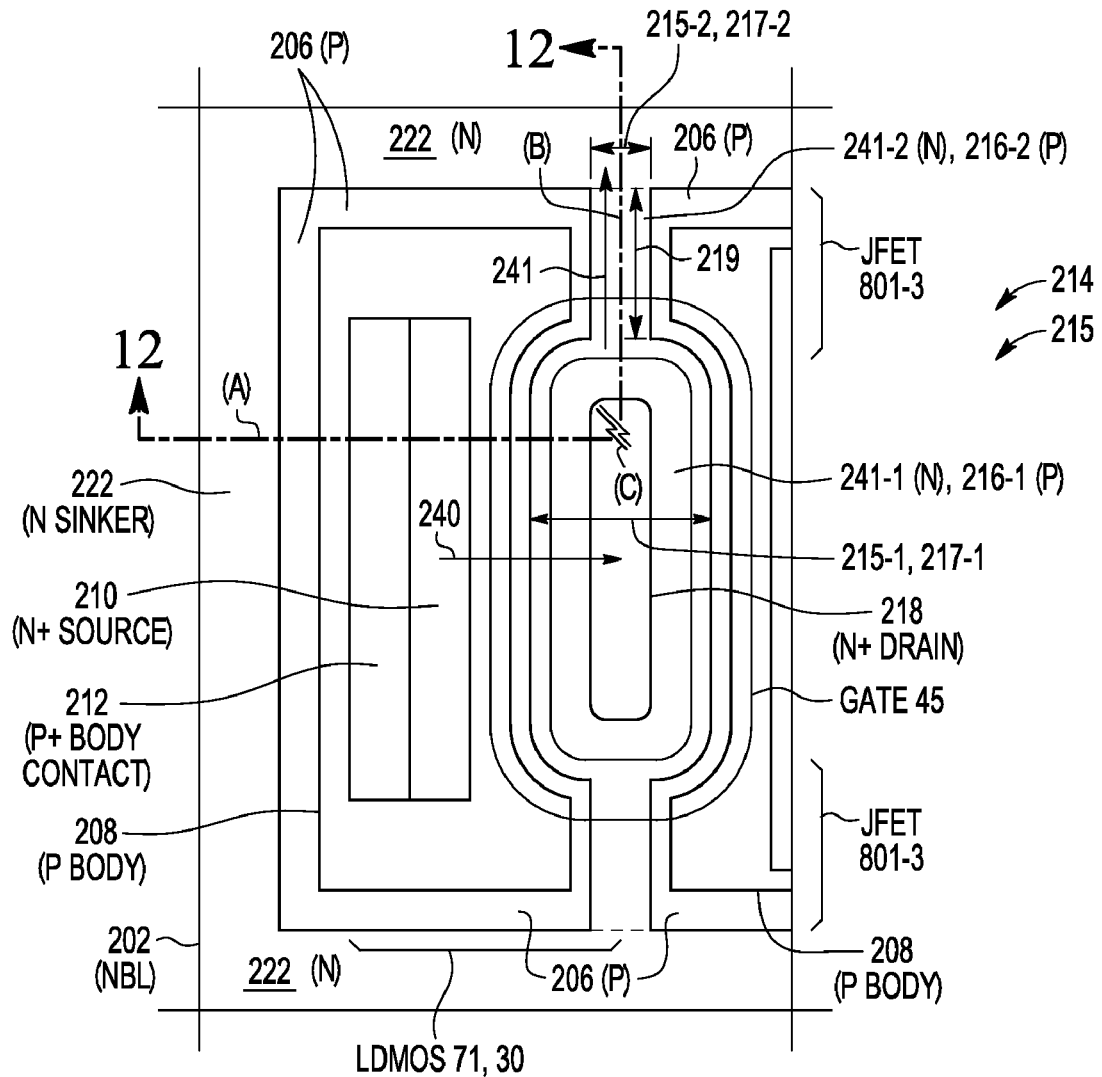
FIG. 11 is a simplified plan view of a portion of a transistor of the type illustrated in FIG. 5, showing how the device of FIG. 5 may be conveniently implemented in a monolithic substrate using a lateral JFET buried layer noise immunity clamp, according to a still yet further embodiment of the present invention.
Figure 12:
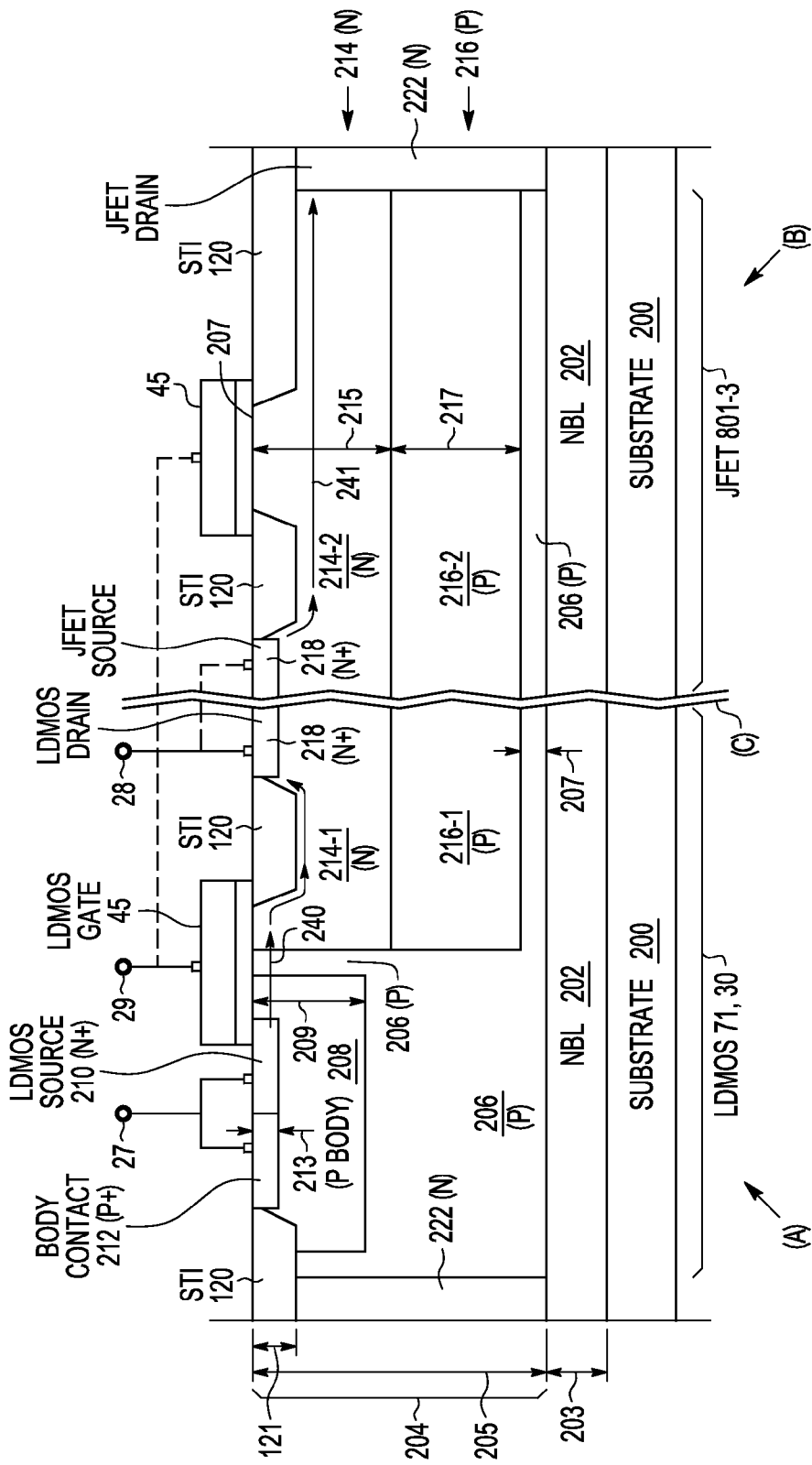
FIG. 12 is a simplified cross-sectional view of the transistor of FIG. 11 showing further details, according to a yet still further embodiment of the present invention.

FIG. 11 is a simplified plan view and FIG. 12 is a simplified cross-sectional view at the locations indicated in FIG. 11, of transistor 70-3 of the type illustrated in FIG. 5, showing how device 70' of FIG. 5 may be conveniently implemented in a monolithic substrate using lateral JFET buried layer noise immunity clamp 801-3, according to a still yet further embodiment of the present invention. Portion (A) at the left of break-line (C) in FIG. 12 corresponds to the cross-section at location (A) of FIG. 11 and portion (B) to the right of break-line (C) in FIG. 12 corresponds to cross-section (B) of FIG. 11. The same reference numbers are used in FIGS. 11 and 12 to facilitate correlation between the various regions in both drawings and to FIG. 5 where appropriate. Conductive (e.g., metal and/or silicide) contacts and interconnections and shallow trench isolations (STI) regions have been omitted in FIG. 11 to avoid obscuring the invention and the various included regions in FIG. 11 are assumed to be transparent so that the relative location of underlying and overlying regions may be easily seen. STI regions 120 are shown in FIG. 12. FIGS. 11 and 12 are discussed together. The thickness and doping of the various regions making up transistor 70-3 are described more fully in connection with FIGS. 13-21. As before, the conductivity type (e.g., N or P) of various regions within device 70-3 are indicated by way of example to facilitate understanding and not intended to be limiting, and the designations "first conductivity type" (either N or P) and "second, opposite, conductivity type" (then either P or N) may more generally be used hereafter and in the claims that follow. Those portions of transistor 70-3 corresponding to LDMOS transistor 71 (and parasitic bipolar transistor 30) and lateral JFET 801 of FIG. 5 are indicated in FIGS. 11-12 as "LDMOS 71, 30" and "JFET 801-3".

Transistor 70-3 of FIGS. 11-12 comprises semiconductor (SC) containing substrate 200 (e.g., P type) with overlying buried layer 202 (e.g., N type, abbreviated as "NBL 202"). Above buried layer 202 is further overlying (e.g., P type epi) SC region 204 of thickness 205 extending to surface 207. Reference number 206 is used to identify those portions of overlying SC region 204 not occupied by other doped regions described hereafter. Located within overlying region 204 is body region 208 (e.g., P type) of thickness 209. Body region 208 is generally of somewhat higher doping concentration than overlying region 204, 206. Within body region 208 are (e.g., N+) source region 210 corresponding to source 22 of FIG. 5 and (e.g., P+) body contact region 212. Also located within overlying SC region 204 are (e.g., N type) carrier drift region 214 of thickness 215 and (e.g., P type) RESURF region 216 of thickness 217, which generally underlies carrier drift region 214. Those portions of regions 214, 216 comprising LDMOS 30, 71 are identified as 214-1, 216-1 respectively and those portions of regions 214, 216 comprising JFET 801-3 are identified as 214-2, 216-2, respectively. As is well known in the art, to obtain RESURF action, charge balancing should be provided between regions 214-1 and 216-1 and is hereafter presumed. Doped contact (e.g., N+) region 218 corresponding to drain 24 of FIG. 5 is provided within carrier drift region 214 extending to surface 207. When source terminal 27, drain terminal 28 and gate terminal 29 are appropriately biased, conductive channel 240 forms between source region 210 and drain region 218. Shallow Trench Isolation (STI) regions 120 of depth 121 are provided extending from surface 207 into SC region 204 in the locations indicated. STI regions 120 may be omitted in other embodiments. Sinker regions 222 (e.g., N type) extend from beneath STI region 120 (when present) through further SC region 104 to make non-rectifying electrical contact to buried layer 202. JFET switching device 801-3 with channel region 214-2 is conveniently formed between sinker region 222 and carrier drift region 214-1. Regions 214-1 and 214-2 are conveniently portions of common region 214 of thickness 215. It is desirable that (e.g., P type) gate region 216-2 is provided beneath JFET channel region 214-2. Regions 216-1 and 216-2 are conveniently portions of common region 216 of thickness 217. LDMOS drain region 218 (e.g., N+) also acts as the source of JFET 801-3, and sinker region 222 (e.g., N) acts as the drain of JFET 801-3. Normally-ON JFET 801-3 is adapted to have normally-ON conductive channel 241 extending between doped region 218 and sinker region 222 until JFET 801-3 turns OFF with rising voltage. It will be noted that channel 240 of MOSFET 71, 30 of FIGS. 11-12 and channel 241 of JFET 801-3 of FIGS. 11-12, while both substantially lateral rather than vertical, are oriented in the embodiment of FIGS. 11-12 in different plan-view directions (e.g., see FIG. 11). Stated another way, channels 240, 241 are substantially orthogonal in plan view in the embodiment of FIGS. 11-12, but may be substantially parallel in plan view in other embodiments. Either arrangement is useful. JFET 801-3 desirably has channel length 219 (see FIG. 11) between drain region 218 and sinker region 222 usefully in the range of about 1.0 to 10.0 micrometers, more conveniently in the range of about 2.0 to 5.0 micrometers and preferably about 2.0 micrometers, but larger or smaller values may also be used. JFET 801-3, desirably has lateral channel width 215-2 (see FIG. 11) usefully in the range of about 0.1 to 2.0 micrometers, more conveniently in the range of about 0.5 to 2.0 micrometers and preferably about 1.0 micrometers, but larger or smaller values may also be used. Stated another way, lateral widths 215-2, 217-2 of portions 214-2, 216-2 of JFET 801-3 are only about X % of widths 215-1, 217-1 of regions 214-1, 216-1 of LDMOS 71, 30 where X has values usefully in the range of about 10 to 80%, more conveniently in the range of about 20 to 50% and preferably about 35%.

The doping and dimensions of JFET transistor 801-3 are desirably chosen so that JFET transistor 801-3 is in a normally-ON state when the drain-source voltage $V_{DS}$ is substantially zero, and has a threshold voltage |Vt|>0 such that, JFET transistor 801-3 turns off as $V_{DS}$ increases. By controlling the threshold voltage Vt of JFET 801-3, the transition from the low noise coupling region for $|V_{DS}|<|Vt|$ into the normal floating RESURF action region of device behavior may be controlled, which is a further advantage of the described embodiments. This is illustrated in connection with FIG. 7. In a preferred embodiment, Vt is usefully in the range of about 0.1 to 10.0 volts, more conveniently in the range of about 0.5 to 5.0 volts and preferably about 1.0 to 2.0 volts, but larger or smaller values may also be used. As long as JFET transistor 801-3 is substantially conductive (e.g., for voltage <|Vt|), the voltage $V_{BL}$ of buried layer 202 is substantially clamped and cannot rise significantly and noise coupling thereto is insignificant, thereby substantially improving the noise immunity of LDMOS device 70-3 and the IC or other circuit of which it is a part. The arrangement of FIGS. 11-12 is desirable because it is particularly compact and may be made using only mask changes and available process procedures without the added cost of modified doping recipes, etc., although such modifications are not precluded. This is a significant advance in the art and of great practical value.

By including normally-ON switching devices 80, 80' and in preferred embodiments JFETS 801, 801' of FIGS. 3-6 and elsewhere, buried layers 102, 142, 172, 202 of FIGS. 8-12 are conditionally floating buried layers, that is, pinned to one or the other of source terminal 27, 47 or drain terminal 28 for voltages less than the threshold voltage |Vt| of the normally-ON switching device or JFET (80, 80', 801, 801', 801-1, 801-1', 801-2, 801-3, etc.) and floating after the normally-ON switching device or JFET (80, 80', 801, 801', 801-1, 801-1', 801-2, 801-3, etc.) turns OFF for voltages above |Vt|.

FIGS. 13-21 are simplified cross-sectional views through the device of FIGS. 11-12 at different stages 313-321 of manufacture showing resulting structures 413-421, according to still yet further embodiments of the present invention. Persons of skill in the art will understand that the manufacturing sequence illustrated herein can generally also be used to form those devices illustrated in cross-section in FIGS. 8-10. Modifications needed to provide regions of somewhat different lateral extent, thickness and/or doping if needed are within the capabilities of those of skill in the art.

Figure 13:
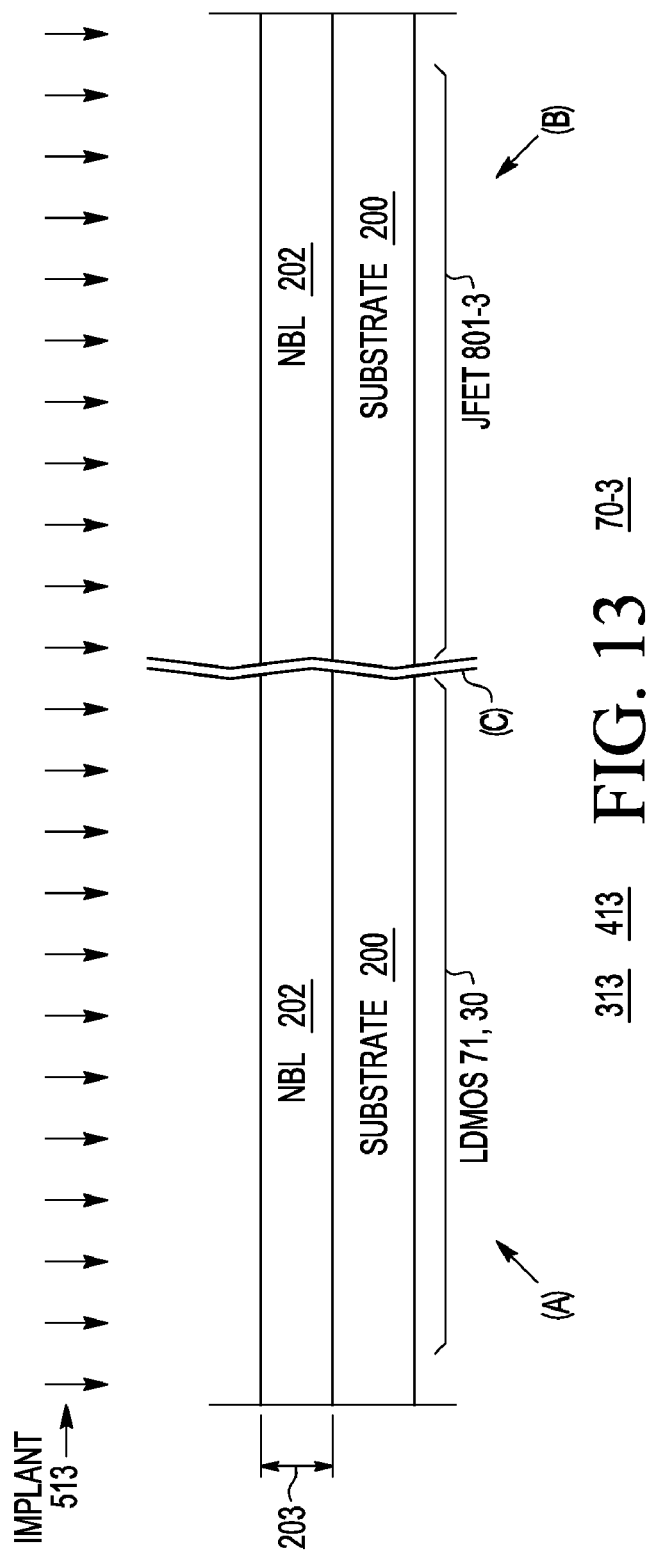
FIGS. 13-21 are simplified cross-sectional views through the device of FIGS. 11-12 at different stages of manufacture according to additional further embodiments of the present invention.

Referring now to manufacturing stage 313 of FIG. 13, semiconductor (SC) containing substrate 200 is provided in which is formed buried layer 202 of thickness 203, for example by ion implant 513, but other doping means well known in the art may also be used. Substrate 200 is analogous to substrates 100, 140, 170 and buried layer 202 is analogous to buried layers 102, 142, 172 of FIGS. 8-10 and the various doping and thickness ranges provided below apply generally thereto, but other values may also be used. In preferred embodiments, at least the upper portion of substrate 200 is P type with doping density usefully in the range of about 1E15 to 1E18 $cm^{-3}$, more conveniently in the range of about 1E15 to 1E16 $cm^{-3}$ and preferably about 2E15 $cm^{-3}$, although higher and lower values can also be used and other doping types. Antimony is a suitable dopant for implant 513. Buried layer 202 is desirably N type with doping density usefully in the range of about 5E18 to 1E20 $cm^{-3}$, more conveniently in the range of about 1E19 to 1E20 $cm^{-3}$ and preferably about 2E19 $cm^{-3}$, although higher and lower values can also be used and other doping types. Thickness 203 is usefully in the range of about 0.5 to 3.0 micrometers, more conveniently in the range of about 1.0 to 2.5 micrometers and preferably about 1.5 micrometers, but larger and smaller values may also be used. Structure 413 results.

Figure 14:
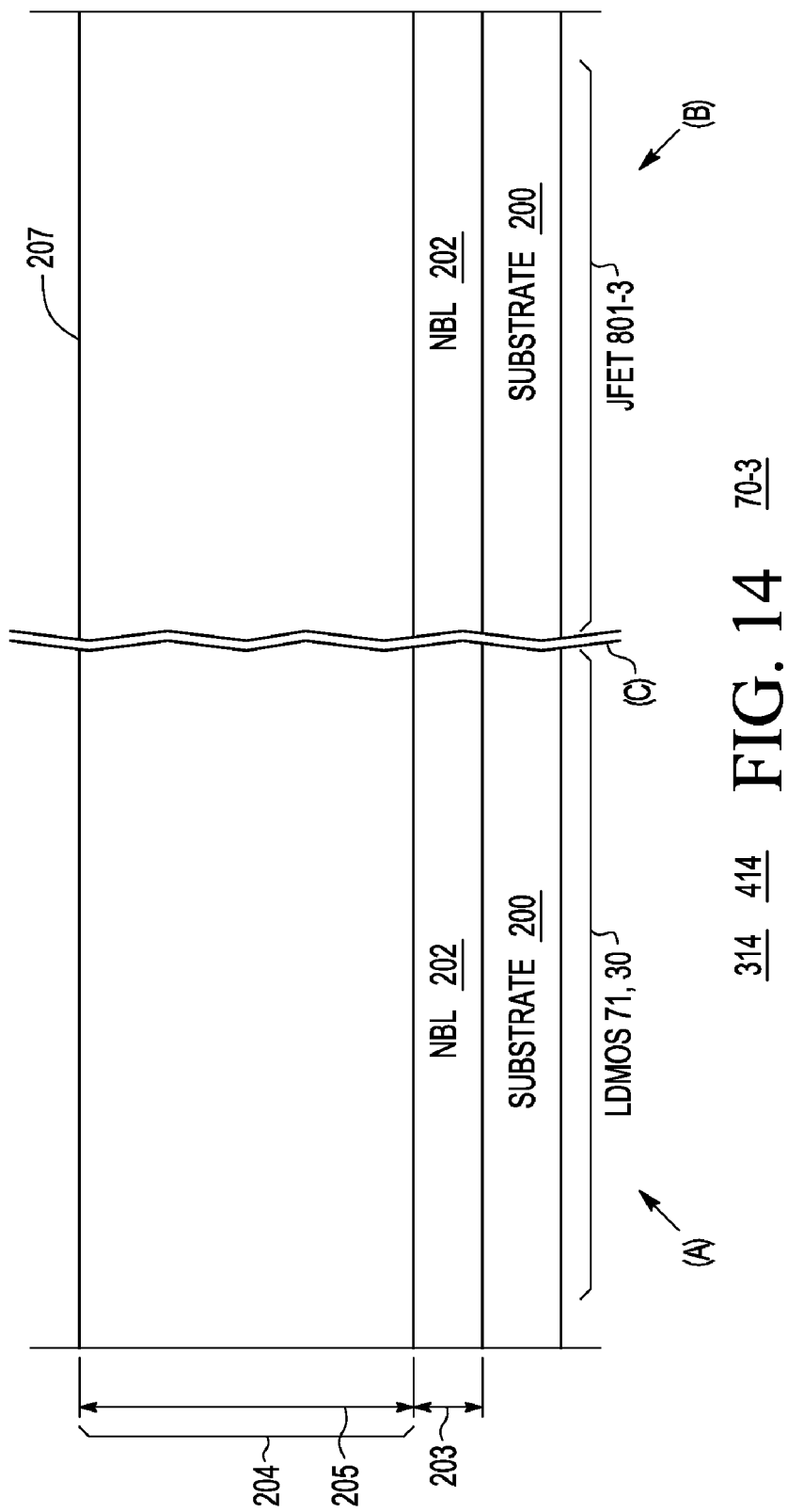

Referring now to manufacturing stage 314 of FIG. 14, overlying SC region or layer 204 of thickness 205 extending to upper surface 207 is formed above buried layer 202, for example by epitaxial growth, although other well known techniques may also be used to form structure 414 resulting from manufacturing stage 314. Unless otherwise noted as to conductivity type, layer or region 204 is analogous to layers or regions 104, 144, 174 of FIGS. 8-10 and the doping and thickness ranges provided below also apply generally thereto, although other values may also be used. Layer or region 204 is desirably P type with doping density usefully in the range of about 5E14 to 5E16 $cm^{-3}$, more conveniently in the range of about 1E15 to 1E16 $cm^{-3}$ and preferably about 2E15 $cm^{-3}$, although higher and lower values can also be used and other doping types. Thickness 205 is usefully in the range of about 0.5 to 10 micrometers, more conveniently in the range of about 2 to 5 micrometers and preferably about 4 micrometers, but larger and smaller values may also be used. Structure 414 results.

Figure 15:
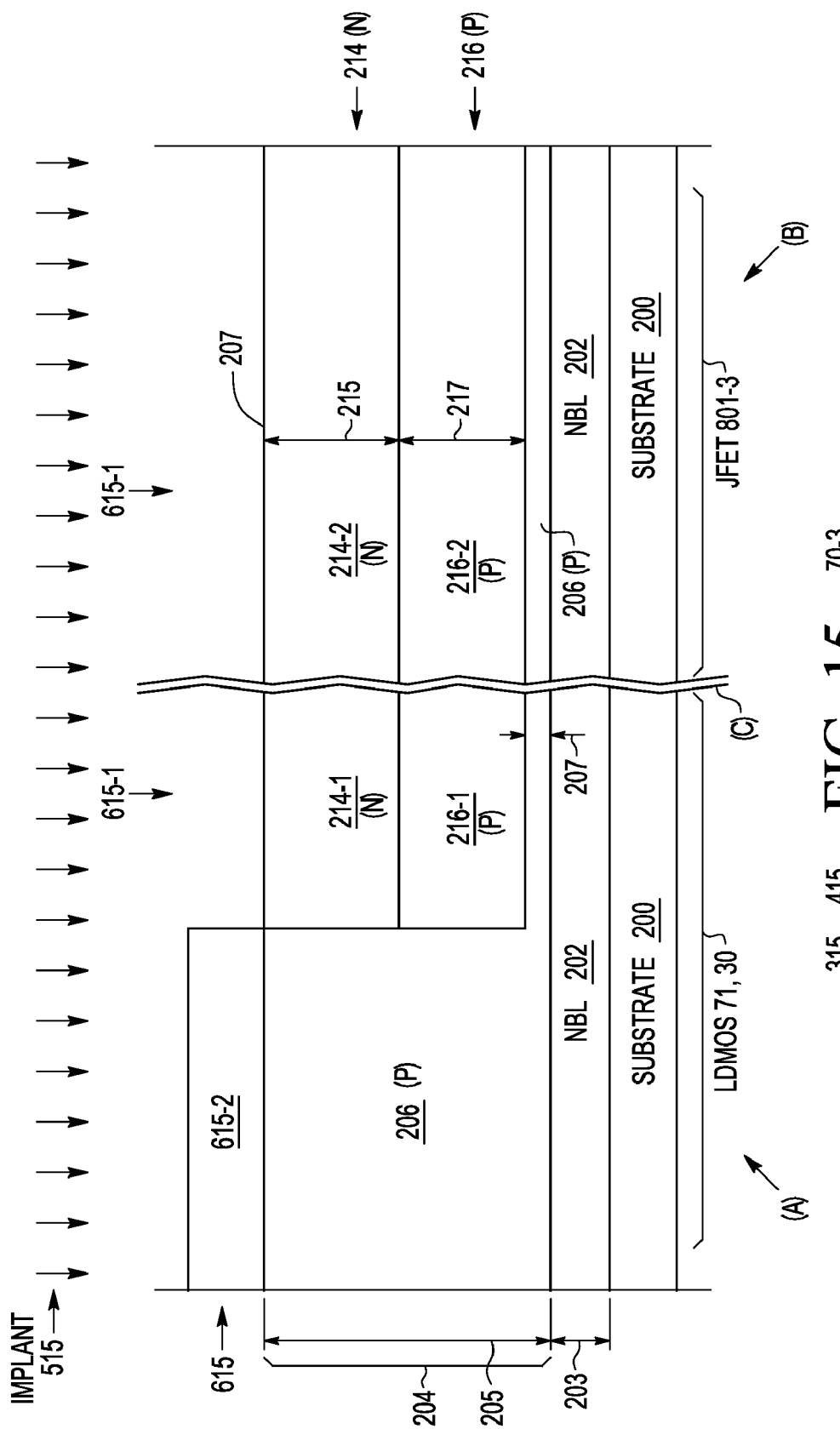

Referring now to manufacturing stage 315 of FIG. 15, mask 615 is applied above surface 207 with closed portion 615-2 and opening 615-1. Ion implant 515 is desirably used to form superposed doped region 214 of thickness or depth 215 and doped region 216 of thickness or depth 217 through opening 615-1. Unless otherwise noted as to conductivity type, regions 214, 216 are analogous to regions 114, 115 and 154, 156 and 184, 186 of FIGS. 8-10 and the doping and thickness ranges provided below also apply generally thereto, but other values may also be used. A chain implant is preferred although separate implants may also be used in other embodiments. Region 214 is conveniently N type and region 216 is conveniently P type, but other doping types may be used in other embodiments. Phosphorous is a suitable dopant for forming region 214 and Boron is a suitable dopant for forming region 216, with the implant energies being selected to provide depths 215, 217 respectively. Region 214 has a peak doping density usefully in the range of about 1E16 to 1E17 $cm^{-3}$, more conveniently in the range of about 2E16 to 5E16 $cm^{-3}$ and preferably about 4E16 $cm^{-3}$, although higher and lower values and other doping types can also be used. Depth 215 is usefully in the range of about 0.5 to 2.0 micrometers, more conveniently in the range of about 0.5 to 1.5 micrometers and preferably about 1.0 micrometers, but larger and smaller values may also be used. Region 216 has a peak doping density usefully in the range of about 1E16 to 5E16 $cm^{-3}$, more conveniently in the range of about 2E16 to 4E16 $cm^{-3}$ and preferably about 2E16 $cm^{-3}$, although higher and lower values and other doping types can also be used. Depth 217 is usefully in the range of about 0.5 to 3.0 micrometers, more conveniently in the range of about 1.0 to 2.5 micrometers and preferably about 1.0 micrometers, but larger and smaller values may also be used. Structure 415 results. Similar dopants, doping densities and thicknesses may be used for regions 114, 116, regions 154, 156 and regions 184, 186 of FIGS. 8-10, respectively.

Figure 16:
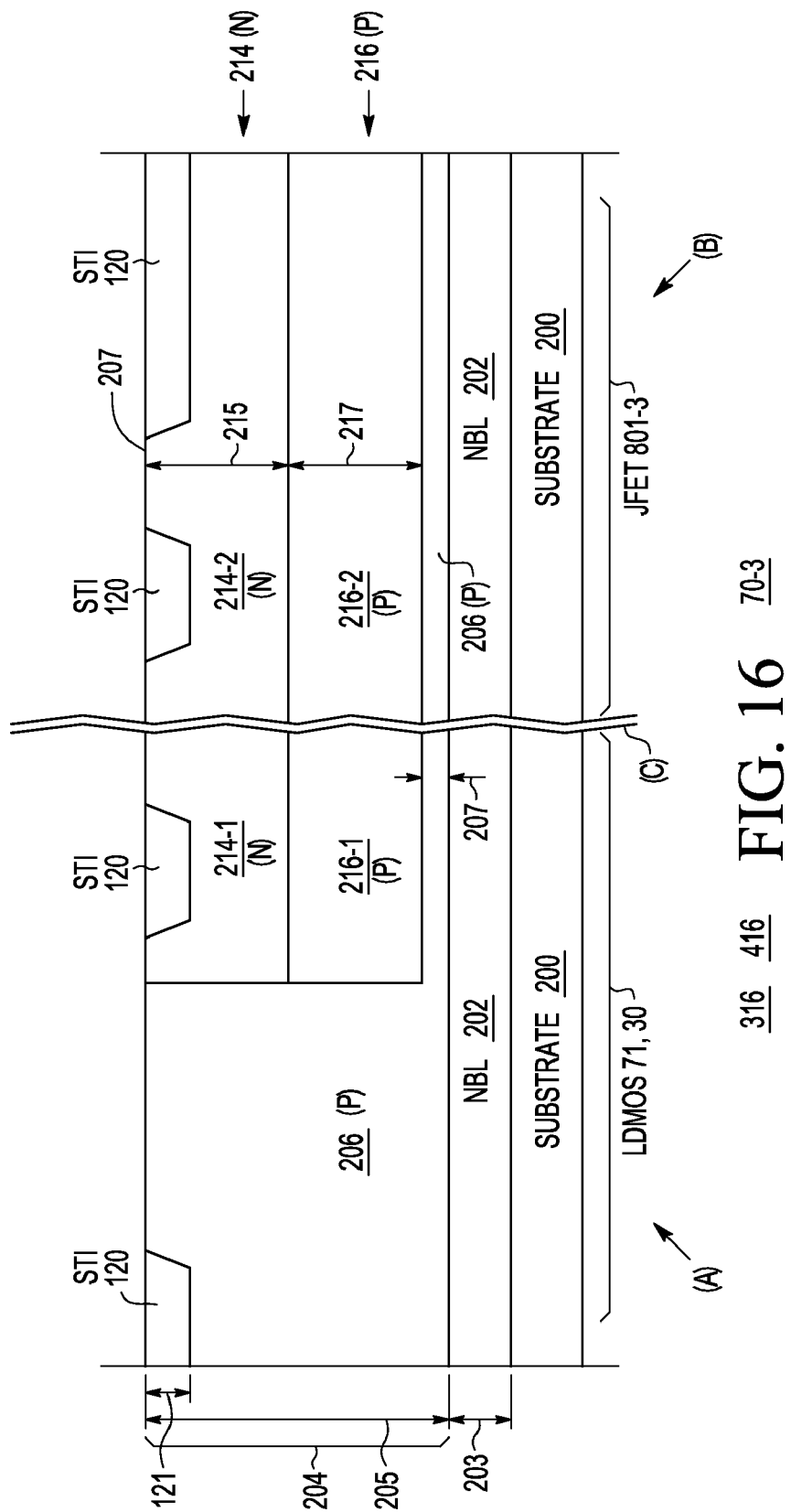

Referring now to manufacturing stage 316 of FIG. 16, mask 615 is removed and shallow trench isolation (STI) regions 120 of thickness of depth 121 are desirably formed at the indicated location using teachings well known in the art. STI regions 120 may be omitted in other embodiments. STI regions 120 of FIGS. 16-21 are analogous to STI regions 120 of FIGS. 8-12. Silicon dioxide is a non-limiting example of a suitable dielectric for STI regions 120 but other well known insulators may also be used. Thicknesses or depth 121 is usefully in the range of about 0.2 to 0.6 micrometers, more conveniently in the range of about 0.3 to 0.5 micrometers and preferably about 0.35 micrometers, but larger and smaller values may also be used. Structure 416 results.

Figure 17:
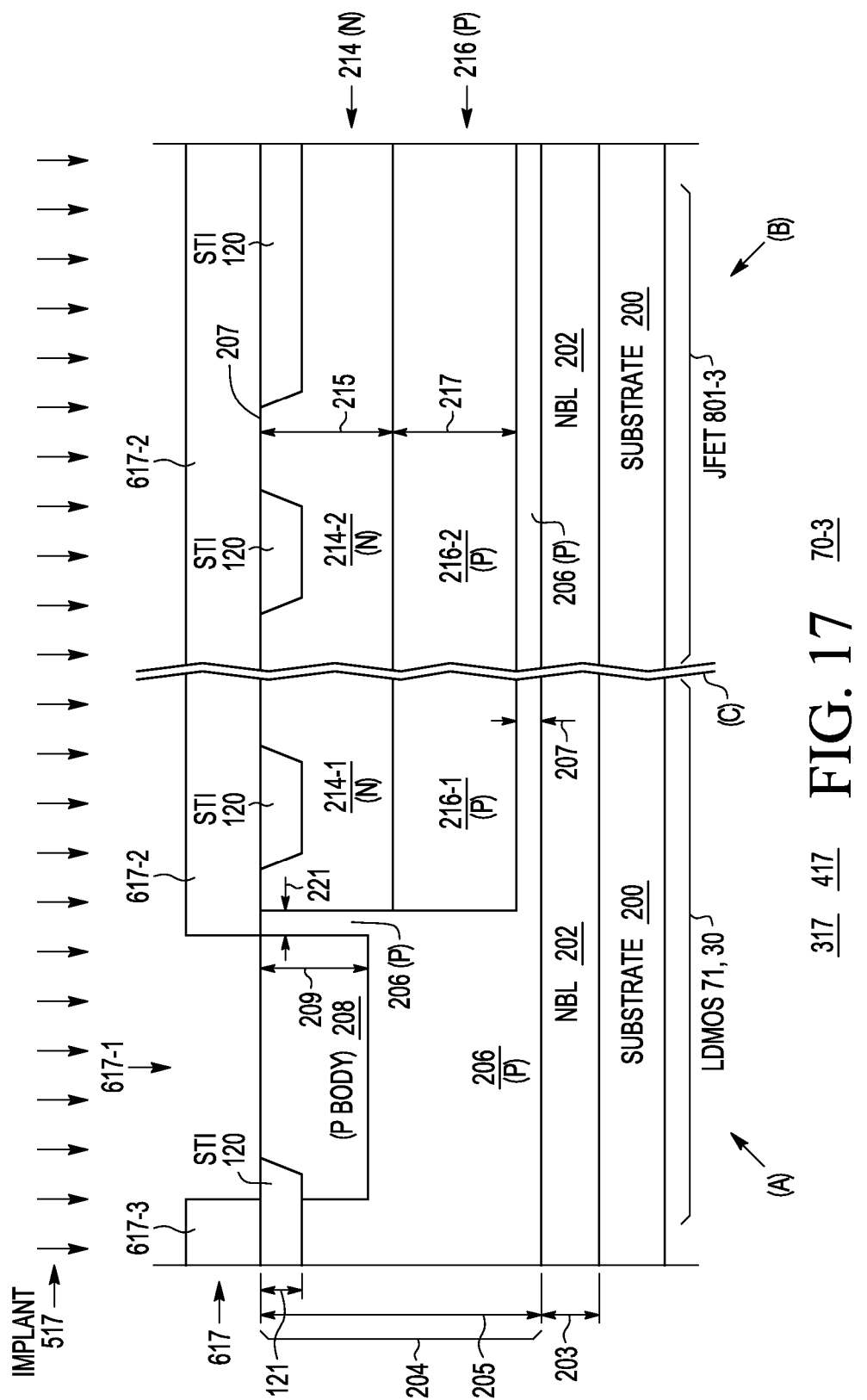

Referring now to manufacturing stage 317 of FIG. 17, mask 617 is applied having opening 617-1 and closed portions 617-2, 617-3. Ion implant 517 is desirably provided to form (e.g., P type) body region 208 of depth or thickness 209, laterally separated from carrier drift region 214-1 by distance 221. Unless otherwise noted, region 208 is analogous to regions 108, 148, 178 of FIGS. 8-10. Boron is a non-limiting example of a suitable dopant. Region 208 has a peak doping density usefully in the range of about 1E17 to 5E18 $cm^{-3}$, more conveniently in the range of about 2E17- to 1E18 $cm^{-3}$ and preferably about 1E18 $cm^{-3}$, although higher and lower values and other doping types can also be used. Depth 209 is usefully in the range of about 0.5 to 2.0 micrometers, more conveniently in the range of about 1.0 to 1.5 micrometers and preferably about 1.0 micrometers, but larger and smaller values may also be used. Structure 417 results.

Figure 18:
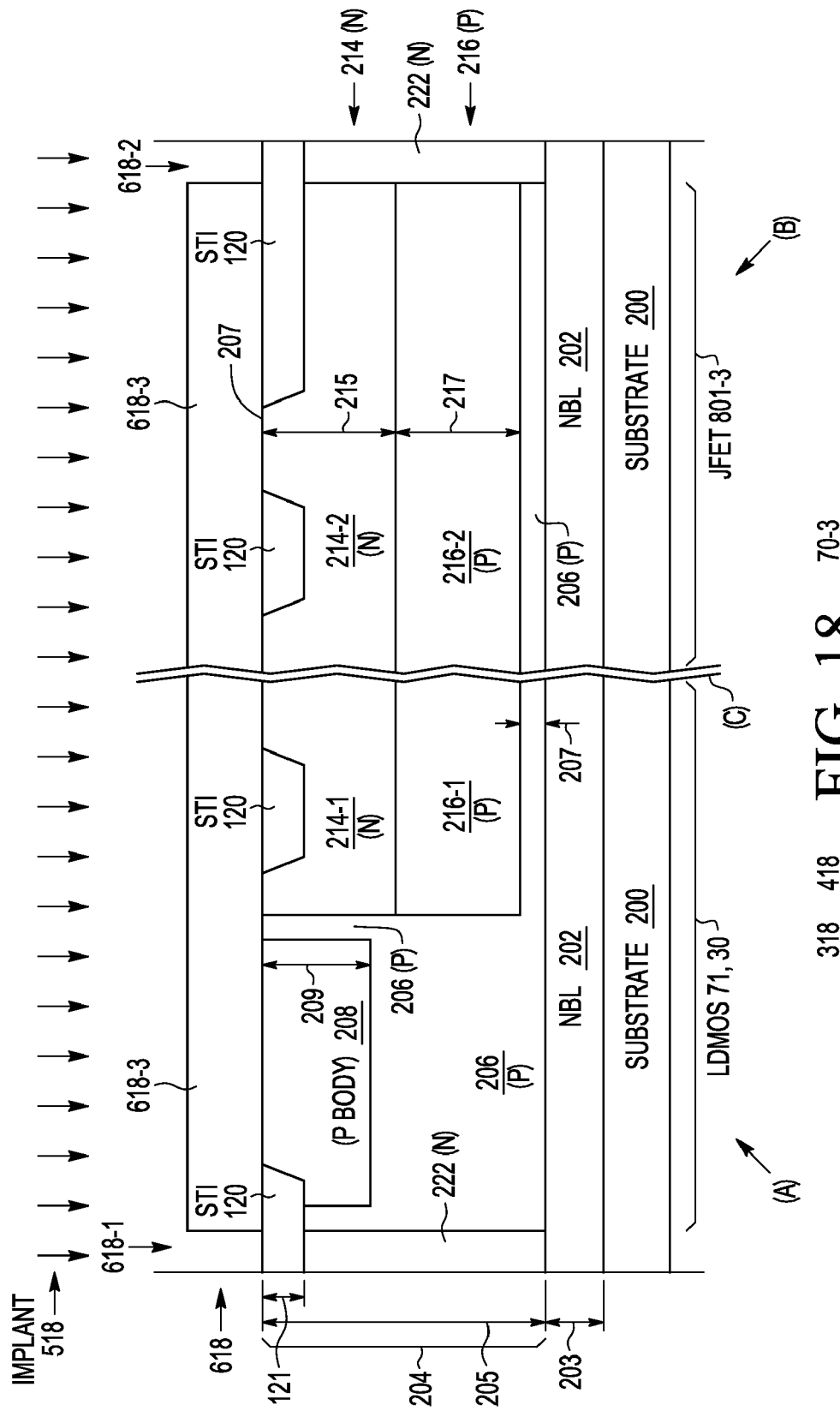
Figure 19:
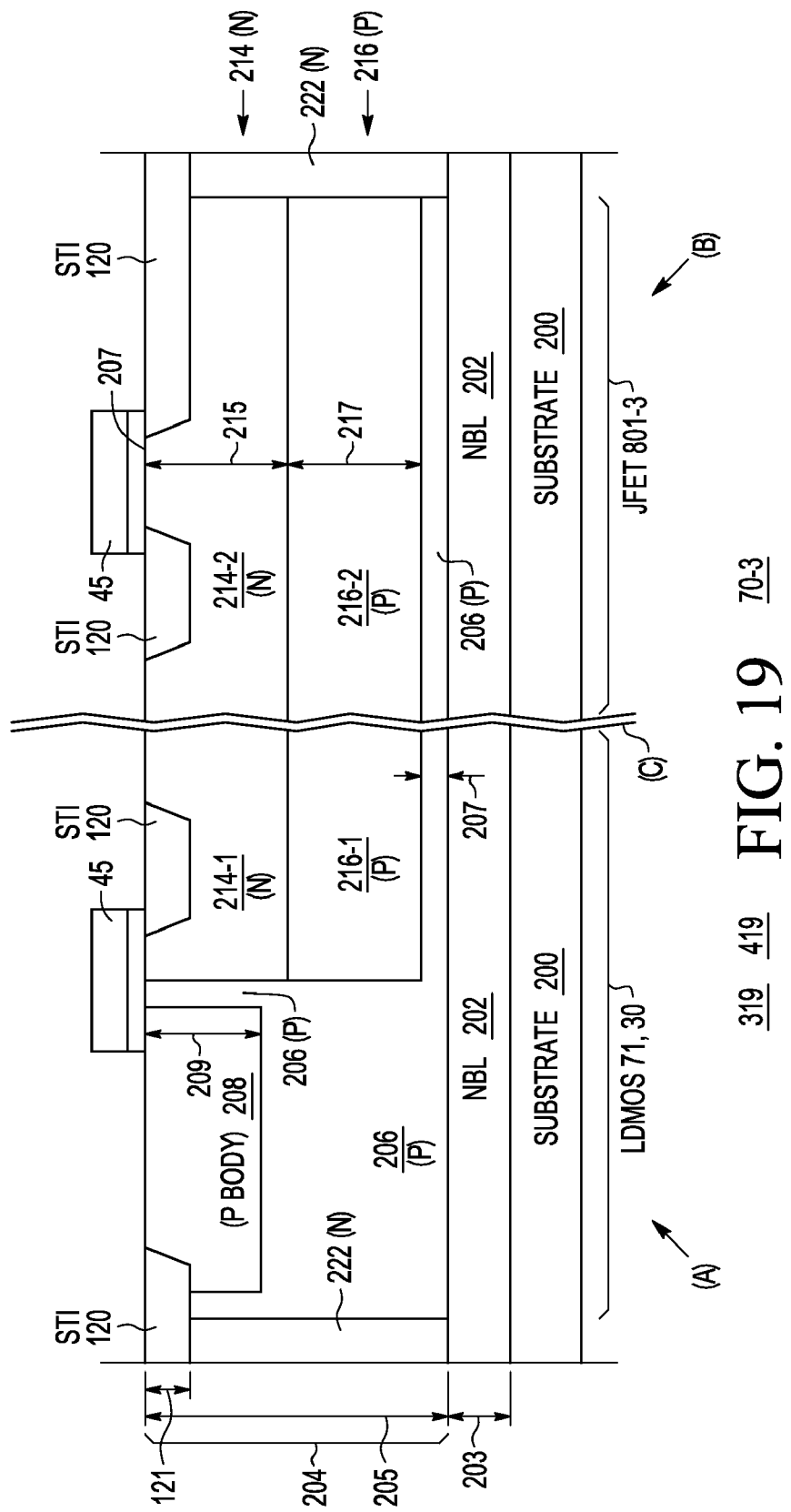
Figure 20:
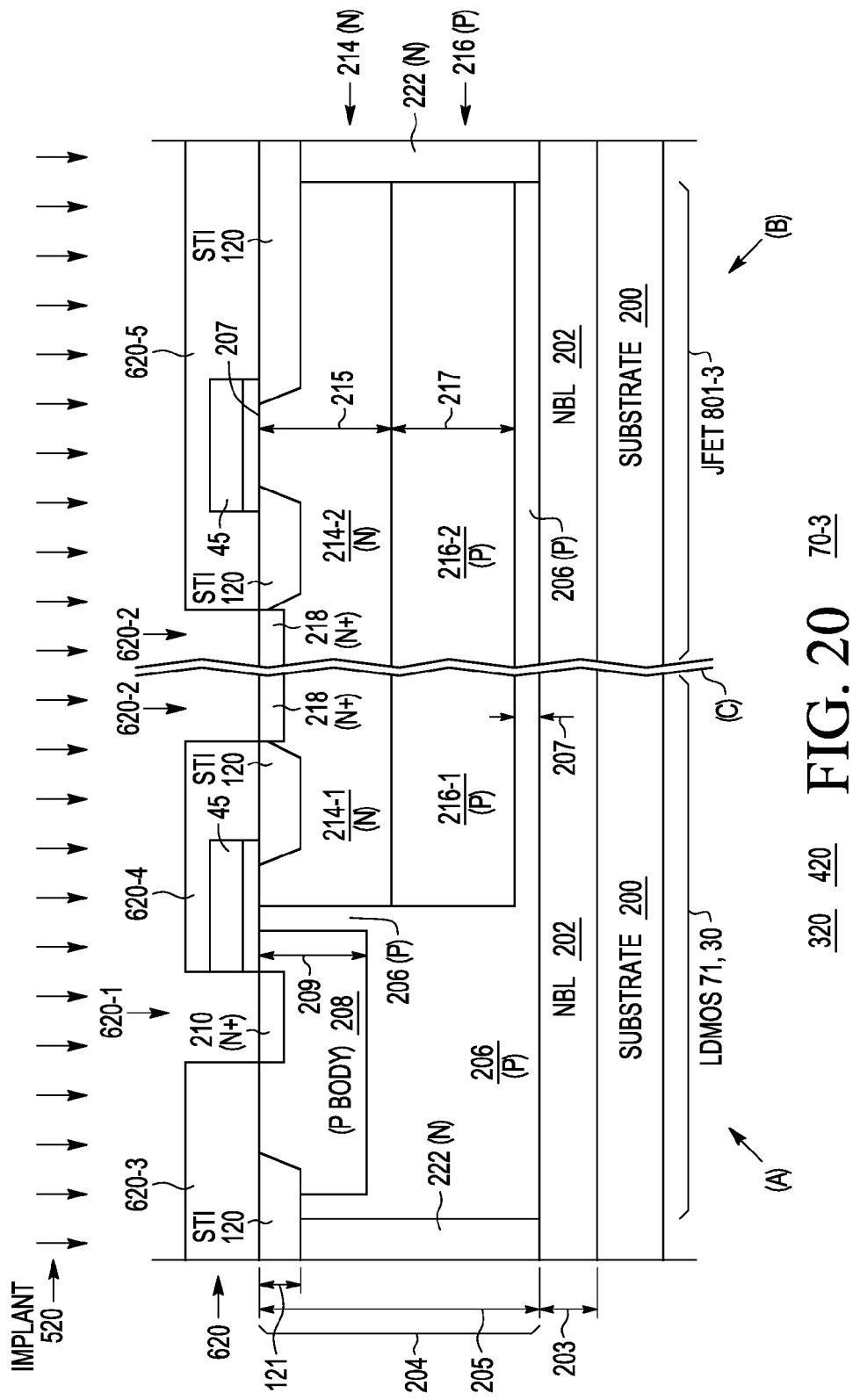
Figure 21:
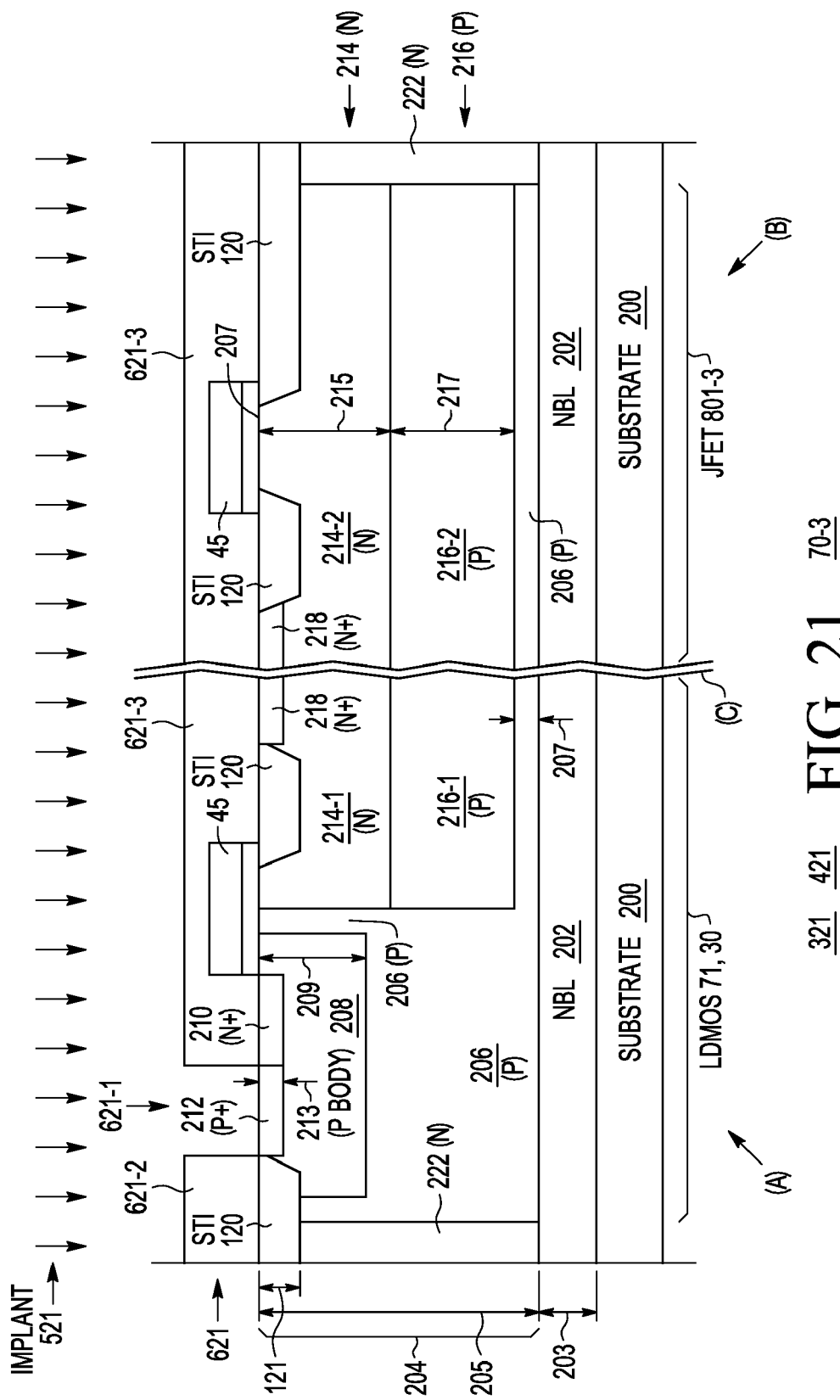

Referring now to manufacturing stage 318 of FIG. 18, mask 617 is removed and mask 618 is applied having openings 618-1, 618-2 and closed portion 618-3. Ion implant 518 is desirably used to form (e.g., N type) sinker regions 222 of depth sufficient to provide non-rectifying electrical contact to buried layer 202. Other doping means well known in the art may also be used in other embodiments. Unless otherwise noted, region 222 is analogous to regions 122, 162, 192 of FIGS. 8-10 and the doping and other information provided below applies generally thereto. Phosphorous is a non-limiting example of a suitable dopant. Region 222 has a doping density usefully in the range of about 1E17 to 1E19 $cm^{-3}$, more conveniently in the range of about 2E17- to 5E18 $cm^{-3}$ and preferably about 1E18 $cm^{-3}$, although higher and lower values and other doping types can also be used. Structure 418 results. Referring now to manufacturing stage 319 of FIG. 19, mask 618 is removed and gate 45 is provided overlying a suitable gate insulator on surface 207 in the indicated location, using means well known in the art. Gate 45 of FIGS. 19-21 is analogous to gates 25, 45 of FIGS. 8-12. Structure 419 results.

Referring now to manufacturing stage 320 of FIG. 20, mask 620 is provided on surface 207, having openings 620-1, 620-2 and closed portions 620-3, 620-4, 620-5. Implant 520 is provided through openings 620-1, 620-2 so as to form (e.g., N+) region 210 in body region 208 and (e.g., N+) region 218 in carrier drift region 214. Phosphorous is a non-limiting example of a suitable dopant for regions 210, 218 with a doping density usefully in the range of about 1E19 to 1E21 $cm^{-3}$, more conveniently in the range of about 2E19 to 5E20 $cm^{-3}$ and preferably about 1E20 $cm^{-3}$, although higher and lower values and other doping types can also be used. Regions 210, 218 may be relatively shallow, with a depth usefully in the range of about 0.1 to 0.5 micrometers, more conveniently in the range of about 0.1 to 0.3 micrometers and preferably about 0.2 micrometers, but larger and smaller values may also be used. Structure 420 results. Regions 110, 118 and region 152 and regions 180, 188 of FIGS. 8-10 may be formed in substantially the same manner as described herein for regions 210, 218.

Referring now to manufacturing stage 321 of FIG. 21, mask 620 is removed and mask 621 is provided on surface 207, having opening 621-1 and closed portions 621-2, 621-3. Implant 521 is provided through opening 621-1 to form (e.g., P+) region 212 in body region 208. Boron is a non-limiting example of a suitable dopant for region 212 with a doping density usefully in the range of about 1E19 to 1E21 $cm^{-3}$, more conveniently in the range of about 2E19 to 5E20 $cm^{-3}$ and preferably about 1E20 $cm^{-3}$, although higher and lower values and other doping types can also be used. Depth 213 is usefully in the range of about 0.1 to 0.5 micrometers, more conveniently in the range of about 0.1 to 0.3 micrometers and preferably about 0.2 micrometers, but larger and smaller values may also be used. Structure 421 results. Region 112 and regions 150, 158 and region 182 of FIGS. 8-10 may be formed by substantially the same manner as described herein for region 212. Following manufacturing stage 321, mask 621 is removed and conductive contacts are made to regions 210, 212, 218 and the interconnections needed to couple such regions to source, drain and gate terminals are formed, using teachings well known in the art, thereby providing the substantially finished structure illustrated, for example, in FIGS. 11-12.

According to a first embodiment, there is provided an electronic device (70, 70', 90. 90'), comprising, an MOS transistor (71, 91) having a source (22, 42), a drain (24. 44) and a gate (25, 45), a conditionally floating buried layer (102, 142, 172, 202) underlying the MOS transistor (71, 91), and a normally-ON switch (80, 80') having a turn-OFF threshold Vt, adapted when in an ON-state to couple the conditionally floating buried layer (102, 142, 172, 202) to one of the source (22, 42) and drain (24, 44), and when in an OFF-state to leave the buried layer (102, 142, 172, 202) substantially floating with respect to the one of the source (22, 42) and drain (24, 44). According to a further embodiment, the normally-ON switch (80, 80') is a junction field effect transistor (801, 801', 801-1, 801-2, 801-1'). According to a still further embodiment, when appropriately biased the MOS transistor (71, 91) is adapted to have a first conductive channel (234, 236) and the junction field effect transistor (801, 801', 801-1, 801-2, 801-1') is adapted to have a second conductive channel (239) laterally separated from the first conductive channel. According to a yet further embodiment, when appropriately biased the MOS transistor (71, 91) is adapted to have a first conductive channel (238) and the junction field effect transistor (801-2) is adapted to have a second conductive channel (239) that at least partly underlies the first conductive channel. According to a still yet further embodiment, the MOS transistor (71, 91) is an N-channel transistor (71) and the buried layer (102, 172, 202) is N type. According to a yet still further embodiment, the MOS transistor (71, 91) is a P-channel transistor (91) and the buried layer (142) is N type. According to another embodiment, the MOS transistor (71, 91) is an LDMOS transistor (71, 91). According to a still another embodiment, the MOS transistor (71, 91) is an LDMOS transistor (71, 91) adapted to have a first conductive channel (240), and the normally-ON switch (80, 80') is a junction field effect transistor (801, 801') adapted to have a second conductive channel (241) and the first and second conductive channels are substantially orthogonal. According to a yet another embodiment, the MOS transistor (71, 91) is an LDMOS transistor (71, 91) adapted to have a first conductive channel (234, 236, 238), and the normally-ON switch (80, 80') is a junction field effect transistor (801, 801') adapted to have a second conductive channel (235, 237, 239) and the first and second conductive channels are substantially parallel.

According to a second embodiment, there is provided an LDMOS transistor (70, 70', 90, 90') having a source region (22, 42, 110, 150, 180, 210) and drain region (24, 44, 118, 158, 188, 218), comprising, a buried SC layer region (102, 142, 172, 202), a further SC region (104, 144, 174, 204) overlying the buried layer region (102, 142, 172, 202) and having an upper surface (107, 147, 177, 207), a MOSFET (71, 91) formed in the further SC region (104, 144, 174, 204), wherein the MOSFET (71, 91) comprises, a body region (108, 154, 178, 208) containing the source region (22, 42, 110, 150, 180, 210) of the LDMOS transistor (70, 70', 90, 90'), and a carrier drift region (114, 148, 184, 214) laterally separated from the body region (108, 154, 178, 208) and containing the drain region (24, 44, 118, 158, 188, 218) of the LDMOS transistor (70, 70', 90, 90'), and a normally-ON junction field effect transistor (801, 801') adapted to have a threshold voltage |Vt|>0, coupled between the buried layer (102, 142, 172, 202) and one of the source region (22, 42, 110, 150, 180, 210) and the drain region (24, 44, 118, 158, 188, 218). According to a further embodiment, the MOSFET (71, 91) is an N channel MOSFET and the buried layer (102, 142, 172, 202) is N type. According to a still further embodiment, the MOSFET (71, 91) is a P channel MOSFET and the buried layer (142) is N type. According to a still further embodiment, $0.1 \leq |Vt| \leq 10$ volts. According to a yet further embodiment, $0.5 \leq |Vt| \leq 5$ volts. According to a yet further embodiment, a channel region (124, 164, 190, 214-2) of the junction field effect transistor (801, 801') has a same conductivity type as the drift region (114, 148, 184, 214).

According to a third embodiment, there is provided a method for providing an LDMOS transistor (70, 70', 90, 90'), comprising, forming a buried layer region (102, 142, 172, 202) of a first conductivity type, forming a further SC region (104, 144, 174, 204) of a second, opposite, conductivity type above the buried layer region (102, 142, 172, 202), and having an upper surface (107, 147, 177, 207), forming a first doped region (114, 124, 154, 164, 190, 214) of the first conductivity type in a first portion of the further SC region (104, 144, 174, 204) extending at least in part to the upper surface (107, 147, 177, 207), wherein a first part (114, 154, 214-1) of the first doped region (114, 124, 154, 164, 190, 214) is adapted to serve as part of the LDMOS transistor (71, 91) and a second part (124, 164, 190, 214-2) of the first doped region (114, 124, 154, 164, 190, 214) is adapted to serve as a channel of a normally-ON junction field effect transistor (71, 91), forming a second doped region (116, 156, 186, 216) of the second, opposite, conductivity type in the further SC region (104, 144, 174, 204), substantially underlying the first doped region (114, 154, 184, 214) and not extending to the buried SC layer region (102, 142, 172, 202), forming a third doped region (108, 148, 208) of the second opposite conductivity type extending at least in part to the upper surface (107, 147, 177, 207) and laterally separated from the first doped region (114, 154, 184, 214) by a first distance (221), forming a sinker region (122, 162, 192, 222) making non-rectifying electrical contact to both the second part (124, 164, 190, 214-2) of the first doped region (114, 124, 154, 164, 190, 214) and the buried layer region (102, 142, 172, 202), and forming an electrically conductive gate (45) above the upper surface (107, 147, 177, 207) at least between the third doped region (108, 148, 208) and the first doped region (114, 154, 184, 214). According to a further embodiment, the method further comprises, forming a source region (110, 210) of the first conductivity type of the LDMOS transistor (70, 70', 90, 90') in the third doped region (108, 148, 208) and a drain region (118, 218) of the first conductivity type of the LDMOS transistor (70, 70', 90, 90') in the first doped region (114, 214), wherein the drain region (118, 218) is adapted to also serve as one of the source and drain regions of the normally-ON junction field effect transistor whose channel is formed by the second part (124, 164, 190, 214-2) of the first doped region (114, 124, 154, 164, 190, 214). According to a still further embodiment, the LDMOS transistor (70, 90, 70', 90') is an N-channel LDMOS transistor (70, 70') and the first conductivity type is N type. According to a yet further embodiment, the LDMOS transistor (70, 90, 70', 90') is a P-channel LDMOS transistor (90, 90') and the first conductivity type is N type. According to a still yet further embodiment, the first part (114, 154) of the first doped region (114, 124, 154, 164, 190, 214) has a first depth (115, 155) from an overlying dielectric region (120) proximate the upper surface (107, 147, 177, 207), and the second part (124, 164) of the first doped region (114, 124, 154, 164, 190, 214) has a second depth (117, 157) from the overlying dielectric region (120) that is less than the first depth (115, 155).

While at least one exemplary embodiment and method of fabrication has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic device, comprising:
   an MOS transistor having a source, a drain and a gate;
   a conditionally floating buried layer underlying the MOS transistor; and
   a normally-ON switch having a turn-OFF threshold Vt, adapted when in an ON-state to couple the conditionally floating buried layer to one of the source and drain, and when in an OFF-state to leave the buried layer substantially floating with respect to the one of the source and drain.

2. The electronic device of claim 1, wherein the normally-ON switch is a junction field effect transistor.

3. The electronic device of claim 2, wherein when appropriately biased the MOS transistor is adapted to have a first conductive channel and the junction field effect transistor is adapted to have a second conductive channel laterally separated from the first conductive channel.

4. The electronic device of claim 2, wherein when appropriately biased the MOS transistor is adapted to have a first conductive channel and the junction field effect transistor is adapted to have a second conductive channel that at least partly underlies the first conductive channel.

5. The electronic device of claim 1, wherein the MOS transistor is an N-channel transistor and the buried layer is N type.

6. The electronic device of claim 1, wherein the MOS transistor is a P-channel transistor and the buried layer is N type.

7. The electronic device of claim 1, wherein the MOS transistor is an LDMOS transistor.

8. The electronic device of claim 1, wherein the MOS transistor is an LDMOS transistor adapted to have a first conductive channel, and the normally-ON switch is a junction field effect transistor adapted to have a second conductive channel and the first and second conductive channels are substantially orthogonal.

9. The electronic device of claim 1, wherein the MOS transistor is an LDMOS transistor adapted to have a first conductive channel, and the normally-ON switch is a junction field effect transistor adapted to have a second conductive channel and the first and second conductive channels are substantially parallel.

10. An LDMOS transistor having a source region and drain region, comprising:
    a buried SC layer region;
    a further SC region overlying the buried layer region and having an upper surface;
    a MOSFET formed in the further SC region, wherein the MOSFET comprises:
       a body region containing the source region of the LDMOS transistor, and
       a carrier drift region laterally separated from the body region and containing the drain region of the LDMOS transistor; and
    a normally-ON junction field effect transistor adapted to have a threshold voltage $|Vt|>0$, coupled between the buried layer and one of the source region and the drain region.

11. The LDMOS transistor of claim 10, wherein the MOSFET is an N channel MOSFET and the buried layer is N type.

12. The LDMOS transistor of claim 10, wherein the MOSFET is a P channel MOSFET and the buried layer is N type.

13. The LDMOS transistor of claim 10, wherein $0.1 \leq |Vt| < 10$ volts.

14. The LDMOS transistor of claim 13, wherein $0.5 \leq |Vt| \leq 5$ volts.

15. The LDMOS transistor of claim 10, wherein a channel region of the junction field effect transistor has a same conductivity type as the drift region.

16. A method for providing an LDMOS transistor, comprising:
   forming a buried layer region of a first conductivity type;
   forming a further SC region of a second, opposite, conductivity type above the buried layer region, and having an upper surface;
   forming a first doped region of the first conductivity type in a first portion of the further SC region extending at least in part to the upper surface, wherein a first part of the first doped region is adapted to serve as part of the LDMOS transistor and a second part of the first doped region is adapted to serve as a channel of a normally-ON junction field effect transistor;
   forming a second doped region of the second, opposite, conductivity type in the further SC region, substantially underlying the first doped region and not extending to the buried SC layer region;
   forming a third doped region of the second opposite conductivity type extending at least in part to the upper surface and laterally separated from the first doped region by a first distance; forming a sinker region making non-rectifying electrical contact to both the second part of the first doped region and the buried layer region; and
   forming an electrically conductive gate above the upper surface at least between the third doped region and the first doped region.

17. The method of claim 16, further comprising, forming a source region of the first conductivity type of the LDMOS transistor in the third doped region and a drain region of the first conductivity type of the LDMOS transistor in the first doped region, wherein the drain region is adapted to also serve as one of the source and drain regions of the normally-ON junction field effect transistor whose channel is formed by the second part of the first doped region.

18. The method of claim 16, wherein the LDMOS transistor is an N-channel LDMOS transistor and the first conductivity type is N type.

19. The method of claim 16, wherein the LDMOS transistor is a P-channel LDMOS transistor and the first conductivity type is N type.

20. The method of claim 16, wherein the first part of the first doped region has a first depth from an overlying dielectric region proximate the upper surface, and the second part of the first doped region has a second depth from the overlying dielectric region that is less than the first depth.

* * * * *